United States Patent
Raman et al.

(10) Patent No.: US 9,766,280 B2
(45) Date of Patent: Sep. 19, 2017

(54) SENSOR READOUT WITH REDUNDANCY-CHECKING

(71) Applicant: MELEXIS TECHNOLOGIES N.V., Tessenderlo (BE)

(72) Inventors: Johan Raman, Knesselare (BE); Pieter Rombouts, Mariakerke (BE)

(73) Assignee: MELEXIS TECHNOLOGIES N.V., Tessenderlo (BE)

( * ) Notice: Subject to any disclaimer, the term of this patent is extended or adjusted under 35 U.S.C. 154(b) by 0 days.

(21) Appl. No.: 15/363,604

(22) Filed: Nov. 29, 2016

(65) Prior Publication Data

US 2017/0074915 A1    Mar. 16, 2017

Related U.S. Application Data

(62) Division of application No. 13/442,975, filed on Apr. 10, 2012, now Pat. No. 9,535,103.

(30) Foreign Application Priority Data

Apr. 11, 2011 (GB) .................................. 1106065.4

(51) Int. Cl.
*H04B 3/46* (2015.01)
*G01R 31/20* (2006.01)
(Continued)

(52) U.S. Cl.
CPC ............ *G01R 31/003* (2013.01); *G01L 1/144* (2013.01); *G01L 1/2262* (2013.01); *G01L 9/02* (2013.01);
(Continued)

(58) Field of Classification Search
CPC . G01R 31/003; G01R 31/2829; G01L 1/2262; G01L 1/144; G01L 9/02; G01L 9/04; G01L 9/06; G01L 9/12
(Continued)

(56) References Cited

U.S. PATENT DOCUMENTS

| | | | |
|---|---|---|---|
| 6,421,624 B1 * | 7/2002 | Nakayama | G01R 35/005 324/600 |
| 7,088,108 B2 | 8/2006 | Konig | |
| 2011/0146410 A1 | 6/2011 | Hammerschmidt | |

FOREIGN PATENT DOCUMENTS

| | | |
|---|---|---|
| DE | 4412982 C1 | 9/1995 |
| DE | 10133525 A1 | 1/2003 |

(Continued)

OTHER PUBLICATIONS

European Search Report in corresponding European Application No. EP 12163807, dated Jul. 23, 2012.
(Continued)

*Primary Examiner* — Farhana Hoque
(74) *Attorney, Agent, or Firm* — Bacon & Thomas, PLLC

(57) ABSTRACT

A difference measurement circuit including a first port and a second port for connection to a first set of nodes and a second set of nodes of a sensor unit. The circuit further includes switching units for switching excitation signals emanating from excitation nodes from being applied to the first set of nodes via the first port to being applied to the second set of nodes via the second port and for switching differential measurement signals measured at sensing nodes from being obtained from the second set of nodes via the second port to being obtained from the first set of nodes via the first port. A corresponding method is described. The circuit further includes redundancy testing circuitry for evaluating the similarity or deviation between measurement signals obtained in different states of the switching units.

10 Claims, 15 Drawing Sheets

(51) Int. Cl.
*G01R 31/00* (2006.01)
*G01L 1/14* (2006.01)
*G01L 1/22* (2006.01)
*G01L 9/02* (2006.01)
*G01L 9/04* (2006.01)
*G01L 9/06* (2006.01)
*G01L 9/12* (2006.01)
*G01R 31/28* (2006.01)

(52) U.S. Cl.
CPC ............... *G01L 9/04* (2013.01); *G01L 9/06* (2013.01); *G01L 9/12* (2013.01); *G01R 31/2829* (2013.01)

(58) Field of Classification Search
USPC ................................ 324/537, 543, 750.25
See application file for complete search history.

(56) References Cited

FOREIGN PATENT DOCUMENTS

| | | |
|---|---|---|
| EP | 1111344 A1 | 6/2001 |
| JP | 2004-191189 A | 7/2004 |

OTHER PUBLICATIONS

Search Report of UK IP Office regarding GB 1106065.4, dated Aug. 11, 2011.

* cited by examiner

SENSOR READOUT WITH REDUNDANCY-CHECKING

The present invention relates to sensor readout circuits, more particularly to readout circuits for difference measurement circuits such as impedance bridges, for example to readout circuits for Wheatstone bridges.

BACKGROUND OF THE INVENTION

In many applications where sensor reliability is of utmost importance—for instance safety-critical applications—often multiple sensors are used to measure a same physical parameter. Here, the underlying reliability-increasing principle is redundancy. Unfortunately, introducing redundancy at the level of complete sensors significantly increases the overall cost.

In many cases, even a single sensor already exhibits some internal redundancy. This is often the case in difference measurement bridge circuits such as impedance-based sensors such as for example Wheatstone-based sensors. For instance, in a difference measurement bridge circuit, such as for example but not limited thereto in a piezoresistive pressure sensor, it is common to have two impedances which increase with a physical quantity to be measured ($Z_1$ and $Z_3$ in FIG. 1) and two which decrease with the physical quantity to be measured ($Z_2$ and $Z_4$ in FIG. 1). Up to some technology-related mismatch, there are two pairs of matched devices ($Z_1|Z_3$ and $Z_2|Z_4$) which should behave nearly identical with respect to environmental variables such as pressure and temperature. By checking the similarity of matched sensing elements (e.g., as compared to the expected processing spread), valuable information related to reliability can be obtained.

In most impedance-based sensors, a physical quantity, e.g. change in pressure, temperature etc., causes a change of impedance, which on its turn changes the balance of the bridge. For future reference, a formal definition of the imbalance of two impedances $Z_i$ and $Z_j$ (with i, j $\in \{1; 2; 3; 4\}$) is introduced:

$$\delta_{i,j} = \frac{Z_i(\omega) - Z_j(\omega)}{Z_i(\omega) + Z_j(\omega)}$$

These dimensionless quantities will play a role in the electrical bridge transfer, and will also occur in the redundancy test-equations. For the very frequently occurring case of a resistive bridge, $Z_i = R_i$, with $R_i$ the variable resistances of the sensor unit. Then, the imbalance parameters become:

$$\delta_{i,j} = \frac{R_i - R_j}{R_i + R_j}$$

Conversion of a physical quantity to the electrical domain is done by applying an electrical excitation and sensing the resulting electrical response (FIG. 2).

In a first step, the excitation of the bridge is considered (top row of FIG. 2). There are two ways to excite the bridge: either by applying a voltage over the bridge by means of a voltage source (part (a) of FIG. 2), or by driving a current through the bridge by means of a current source (part (b) of FIG. 2). In both cases, the bottom side of the bridge is typically grounded.

Now the sensing of the bridge output is considered (bottom row of FIG. 2). Here, also two possibilities exist. With voltage-mode sensing (part (c) of FIG. 2) the differential open-circuit voltage $V_{sense}$ is measured at the output of the bridge (with minimal loading of the bridge: $I_{sense} \approx 0$). In contrast, with current-mode sensing the short-circuit current $I_{sense}$ is measured, while actively keeping $V_{sense} \approx 0$.

There is little prior-art on exploiting the internal redundancy of a sensor for increasing the reliability of an overall sensor system. EP1111344 describes an in-range fault detection system for a full Wheatstone bridge element having piezoresistive elements. Two implementations are illustrated, in FIG. 3 and FIG. 4, respectively, i.e. an analog approach and a digital approach. In the above document, a test is implemented which checks whether the common-mode voltage of the bridge output nodes is within a window around the common-mode voltage of the bridge input nodes. Because this test fails under certain mismatch conditions, it can be interpreted as a particular redundancy check. However, it is a disadvantage of the solution proposed in this document that it is not a "complete" test, which can detect all mismatch conditions. This is shown by means of an example. As an example only, it is assumed that R3 and R2 as illustrated in FIG. 3 and FIG. 4 are mismatched: $R_3 = \alpha R_2$ with a $\alpha \neq 1$ a factor accounting for the mismatch. It is further assumed that $R_4$ and $R_1$ are mismatched in the same way, for instance because the mismatch has a common cause (e.g., irregularity in a membrane which provides a same mismatch to the resistances, a large temperature gradient over the sensor). Then also $R_4 = \alpha R_1$. It can be shown that under these circumstances the test does not fail for any a, which clearly shows that even large mismatch conditions could remain undetected. This is most easily demonstrated when using voltage excitation of the bridge: the output voltage INM of the voltage divider $R_3/R_4$ is independent of the scale factor $\alpha$, hence it can be easily recognized that all voltages of the bridge are independent of $\alpha$, and the common-mode test based on these voltages (which obviously must pass for $\alpha = 1$) passes for all values of $\alpha$. The same conclusion holds when current excitation of the bridge is used. These conclusions can also be drawn if the common-mode equality check used in EP1111344 is translated into an expression based on imbalances:

$$\delta_{14} - \delta_{32} \approx 0$$

When the matching is perfect, this test will be exactly equal to zero. However, in real life there will always be some kind of tolerance on the equality, e.g. due to process tolerances. A window is defined within which differences between both imbalances are considered allowable, e.g. differences up to 10%. In EP1111344, the fault detection system has bridge outputs connected to measuring means in the form of a first circuit portion to provide a common mode voltage. A second circuit portion is used to provide a centering voltage equal to the common mode voltage at the time of sensor calibration and a third circuit portion is used to provide a small window voltage which is a fraction of the bridge voltage. The value of the window voltage is subtracted from the value of the centering voltage at a first summing circuit and the results are each compared to the common mode voltage by comparators which are then determined to be within or without a window of valid values by an OR gate.

SUMMARY OF THE INVENTION

It is an object of embodiments of the present invention to provide good difference measurement circuits and methods for operating them.

The above objective is accomplished by a device and a method according to the present invention.

In a first aspect, the present invention provides a difference measurement circuit comprising a first port and a second port for connection to a first set of nodes and a second set of nodes of a sensor unit. The difference measurement circuit further comprises switching units for switching excitation signals emanating from excitation nodes from being applied to the first set of nodes via the first port to being applied to the second set of nodes via the second port and for switching differential measurement signals measured at sensing nodes from being obtained from the second set of nodes via the second port to being obtained from the first set of nodes via the first port. The difference measurement circuit furthermore comprises redundancy testing circuitry for evaluating the similarity or deviation between measurement signals obtained in different states of the switching units. It is an advantage of a difference measurement circuit according to embodiments of the present invention that dynamic reconfiguration of the sensor unit, for example an impedance bridge or any other sensor unit having sufficient symmetry for being reconfigurable, allows testing whether readout values in different configurations obtained at different sample instants are close enough to one another, thus performing a redundancy-test.

In embodiments of the present invention, the redundancy testing circuitry may be adapted for evaluating the similarity or deviation of the differential measurement signals measured at the sensing nodes. In alternative embodiments, the redundancy testing circuitry may be adapted for evaluating the similarity or deviation of measurement signals at excitation nodes resulting from a current and/or a voltage applied as an excitation to the sensor unit at these excitation nodes.

A difference measurement circuit according to embodiments of the present invention may furthermore comprise a measurement circuit for determining a linear combination of voltages at the sensing nodes and/or at the excitation nodes. Such linear combination includes, but is not limited to, common-mode voltage of the excitation nodes and common-mode voltage of the sensing nodes.

The redundancy testing circuitry of a difference measurement circuit according to embodiments of the present invention may furthermore comprise a control unit such as e.g. a processor, adapted for providing a control signal for controlling the switching operation of the switching units. The control unit may be adapted for providing a control signal which toggles at a fixed rate, or for providing a control signal which changes in a pseudorandom or random way. The control unit may be adapted for raising an error when the deviations between measurement signals obtained for different values of the control signals can be attributed to failure of the sensor unit, for example with a predetermined probability, e.g. a probability higher than 95%, such as higher than 99%, for example higher than 99.9%, even for example higher than 99.99%.

A difference measurement circuit according to embodiments of the present invention may furthermore comprise an AD converter for converting an analog measurement signal into a digital signal. This allows to perform processing of the measurement signal in the digital domain; which allows more advanced processing techniques to be used.

A difference measurement circuit according to embodiments of the present invention may furthermore comprise excitation circuitry which is electrically coupled by the switching units to the first port or to the second port, depending on the configuration of the switching units, the excitation circuitry being for excitation of a sensor unit. In particularly useful embodiments of the present invention, the excitation circuitry may be adapted for providing a symmetrical excitation to the sensor unit. Such symmetrical excitation may be obtained in current mode, in voltage mode, or in a hybrid mode. For providing a symmetrical excitation to the sensor unit, the excitation circuitry may comprise a first excitation source electrically connected to the first switching unit and a second excitation source electrically connected to the second switching unit. The symmetrical excitation may for example be obtained by providing current sources which are equal in current value, or voltage sources of which the common mode value of the excitation remains constant.

In difference measurement circuit according to embodiments of the present invention, one of the first or second excitation sources may be an independent source, and the other one of the first or second excitation sources may be an adaptable source. The excitation circuitry may be provided with a feedback circuit for stabilizing the linear combination of the voltages at excitation nodes and/or at sensing nodes to a predetermined value.

Alternatively, in a difference measurement circuit according to embodiments of the present invention, both the first and second excitation sources may be independent sources of nominally equal value, the excitation circuitry further comprising at least one adaptable source specifically configured for injecting, i.e. sourcing or draining, a nominally equal amount of current to both sensing nodes. The excitation circuitry may then further be provided with a feedback circuit for controlling the at least one adaptable source for stabilizing the linear combination of the voltages at excitation nodes and/or at sensing nodes to a predetermined value.

In particular embodiments of a difference measurement circuit according to embodiments of the present invention, the excitation circuitry may comprise a first current source applied between ground and a first switching unit and a second current source applied between a second switching unit and a supply voltage. Such current excitation circuitry provides symmetrical excitation to the sensor unit.

In embodiments of a difference measurement circuit according to embodiments of the present invention, one of the first or second current sources may be a fixed current source, and the other one of the first or second current sources may be an adaptable current source, the excitation circuitry being provided with a feedback loop for making equal the current provided by both current sources. In alternative embodiments of a difference measurement circuit according to embodiments of the present invention, both the first and second current sources may be fixed current sources of nominally equal value, and the excitation circuitry may furthermore being provided with at least one adaptable current source that bypasses the bridge and that is settable to a value which corrects the inevitable small current differences between the fixed sources. These embodiments provide common mode regulation of the bridge.

In other particular embodiments of a difference measurement circuit according to embodiments of the present invention, the excitation circuitry may comprise a first voltage source applied between ground and a first switching unit and a second voltage source applied between ground and a second switching unit.

A difference measurement circuit according to embodiments of the present invention may furthermore comprise a sensor unit. The sensor unit may for example be an impedance bridge, such as e.g. a Wheatstone bridge comprising four resistances or a capacitive bridge.

In particular embodiments of the present invention, a difference measurement circuit may furthermore comprise two additional switching units for changing the sign of the excitation and measurement signals. In combination with the switching units as provided in a basic embodiment of a difference measurement circuit according to embodiments of the present invention, this allows rotation and flip-over of the bridge. This, in turn, allows to carry out a full redundancy test of a sensor unit coupled to the difference measurement circuit according to embodiments of the present invention. According to an alternative embodiment of this approach, the different switching units may be merged into a larger unit which realizes the same connectivity possibilities to allow rotation and flip-over of the bridge.

In a second aspect, the present invention provides a method for reading out a sensor unit, for example a bridge, having a first set of nodes and a second set of nodes. The method comprises changing a readout configuration of the sensor unit by exchanging excitation and sensing between the first set of nodes and the second set of nodes. This corresponds to rotation of the sensor unit. The method furthermore comprises evaluating the similarity or deviation between measurement signals obtained in different readout configurations of the sensor unit.

In a method according to embodiments of the present invention, evaluating the similarity or deviation between measurement signals obtained in different readout configurations of the sensor unit may include evaluating the similarity or deviation of differential measurement signals, for example differential output signals of the sensor unit or differential excitation signals. In alternative embodiments, evaluating the similarity or deviation between measurement signals obtained in different configurations of the sensor unit may include evaluating the similarity or deviation of measurement signals at excitation nodes resulting from a current and/or a voltage applied as an excitation signal to the sensor unit at these excitation nodes.

A method according to embodiments of the present invention may furthermore comprise determining a linear combination of voltages at the first set of nodes and/or at the second set of nodes and delivering this as measurement signal.

Evaluating the similarity or deviation between measurement signals obtained in different configurations of the sensor unit may comprise collecting measurement signals at different time instants.

Evaluating the similarity or deviation between measurement signals obtained in different configurations of the sensor unit may comprise raising an error if the measurement signals differ more from one another than a predetermined value.

A method according to embodiments of the present invention may comprise collecting readout values obtained at the first and the second set of nodes, during subsequent readout operations. In a method according to embodiments of the present invention, these readout values obtained at the first and the second set of nodes may be compared. An error may be raised if these readout values differ more than a predetermined value.

In a method according to embodiments of the present invention, comparing may include taking the difference between the readout values obtained at the first and the second set of nodes. Comparing may include statistical and/or model based inference techniques.

A method according to embodiments of the present invention may furthermore comprise changing the sign of excitation signals applied to the sensor unit and of sensing signals read from the sensor unit. A method according to embodiments of the present invention may comprise sequencing through different configurations with regard to switching between excitation of and sensing at sets of nodes and with regard to changing sign of excitation and sensing signals, and collecting measurement data from the different configurations. Sequencing through different configurations may comprise sequencing through the configurations in a systematic way or in a random way.

In a method according to embodiments of the present invention, a distinction may be made, based on the collected measurement data, between impedance variations due to a sensed physical signal and variations due to mismatch.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Figure 1:
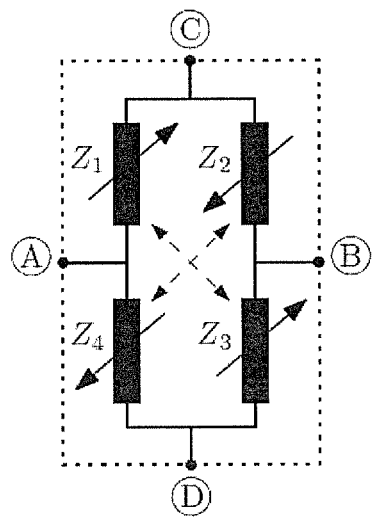
FIG. 1 illustrates an impedance bridge with two pairs of matched impedances $Z_1|Z_3$ and $Z_2|Z_4$ which can be used as a sensor unit to be read out by means of a difference measurement circuit according to embodiments of the present invention.

The drawings are only schematic and are non-limiting. In the drawings, the size of some of the elements may be exaggerated and not drawn on scale for illustrative purposes.

In the different drawings, the same reference signs refer to the same or analogous elements. Any reference signs in the claims shall not be construed as limiting the scope.

DETAILED DESCRIPTION OF THE INVENTION

Figure 5:
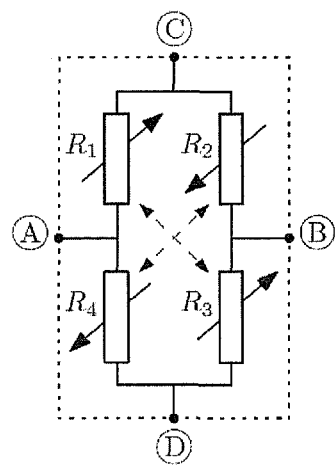
FIG. 5 illustrates a full bridge with two pairs of matched resistances $R_1|R_3$ and $R_2|R_4$, which can be used as a sensor unit to be read out by means of a difference measurement circuit according to embodiments of the present invention.
Figure 6:
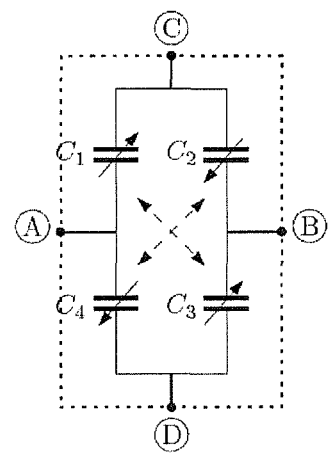
FIG. 6 illustrates a capacitive bridge with two pairs of matched capacitances $C_1|C_3$ and $C_2|C_4$ which can be used as a sensor unit to be read out by means of a difference measurement circuit according to embodiments of the present invention.

An impedance bridge configuration is a very general topology for a sensor unit, including resistive bridges, capacitive bridges or bridges comprising other types of frequency-dependent bridge elements. In FIG. 1, a general impedance bridge is illustrated, comprising four impedances $(Z_1, Z_2, Z_3, Z_4)$. It is assumed that the sensor unit has internal redundancy, and that the pairs $Z_1|Z_3$ and $Z_2|Z_4$ are matched under normal conditions. Apart from this matching property, the impedances are considered general. This includes resistive bridges (FIG. 5), capacitive bridges (FIG. 6), etc. For resistive bridges, the impedance relation becomes $Z_i=R_i$, with $R_i$ the variable resistances of the sensor unit. For capacitive bridges, the impedance relation becomes $$Z_i = \frac{1}{j\omega C_i},$$

where $C_i$ are the variable capacitances of the sensor unit. Also inductance-based bridges (having impedances $Z_i=j\omega L_i$) can be included in embodiments of the present invention (not illustrated in the drawings). In its most general form, impedances with a fairly complex frequency-behavior can be included (e.g. series and parallel combinations of any number of previously mentioned network elements). Although part of the present invention, no detailed description of impedance bridges with impedance elements having such complex frequency-dependent behavior is given hereinafter, as such sensors are less frequent.

Figure 2:
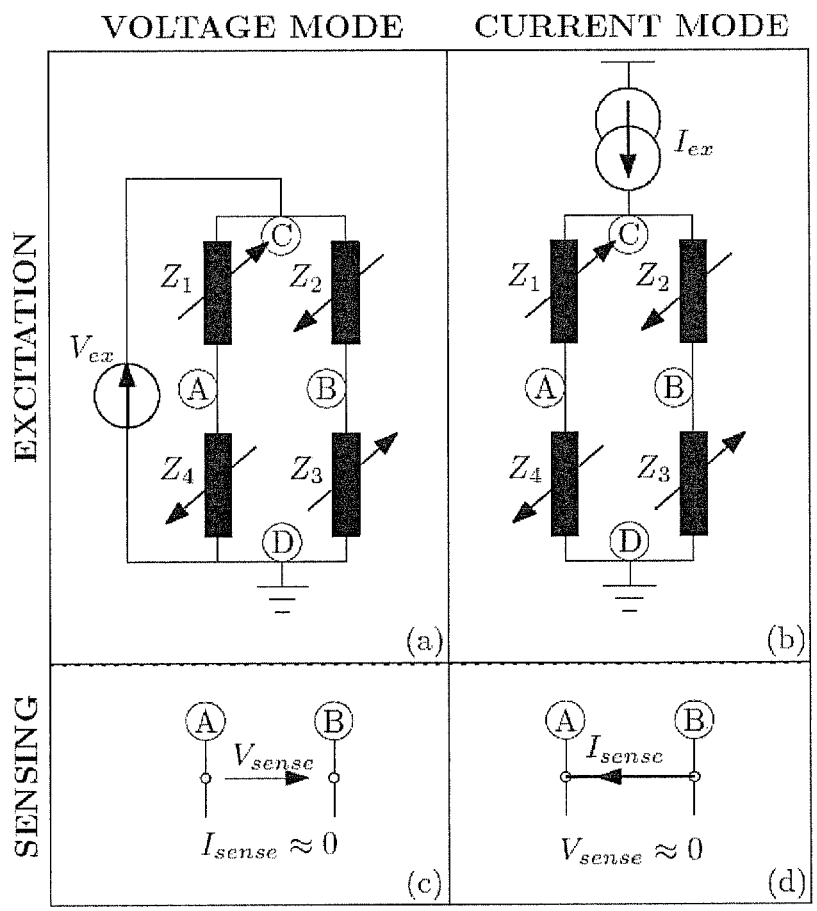
FIG. 2 illustrates traditional readout methods of impedance bridges, applying either voltage-mode excitation or current-mode excitation, and either voltage-mode or current-mode sensing.
Figure 3:
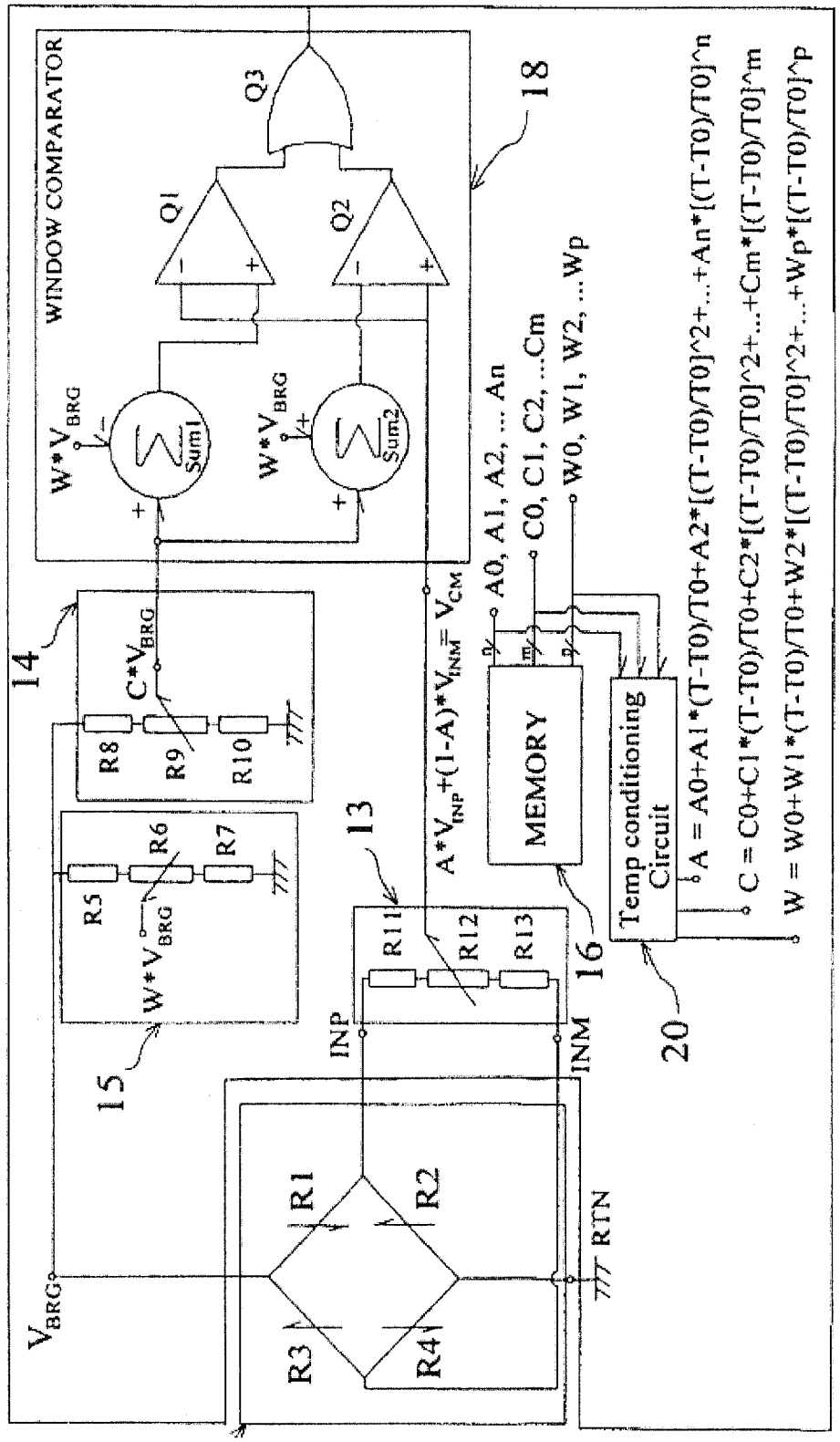
FIG. 3 and FIG. 4 respectively illustrate an analog implementation and a digital implementation of a "common-mode check" which checks whether the common-mode voltage of the bridge output nodes is within a window around the common-mode voltage of the bridge input nodes, as described in EP-1111344.
Figure 4:
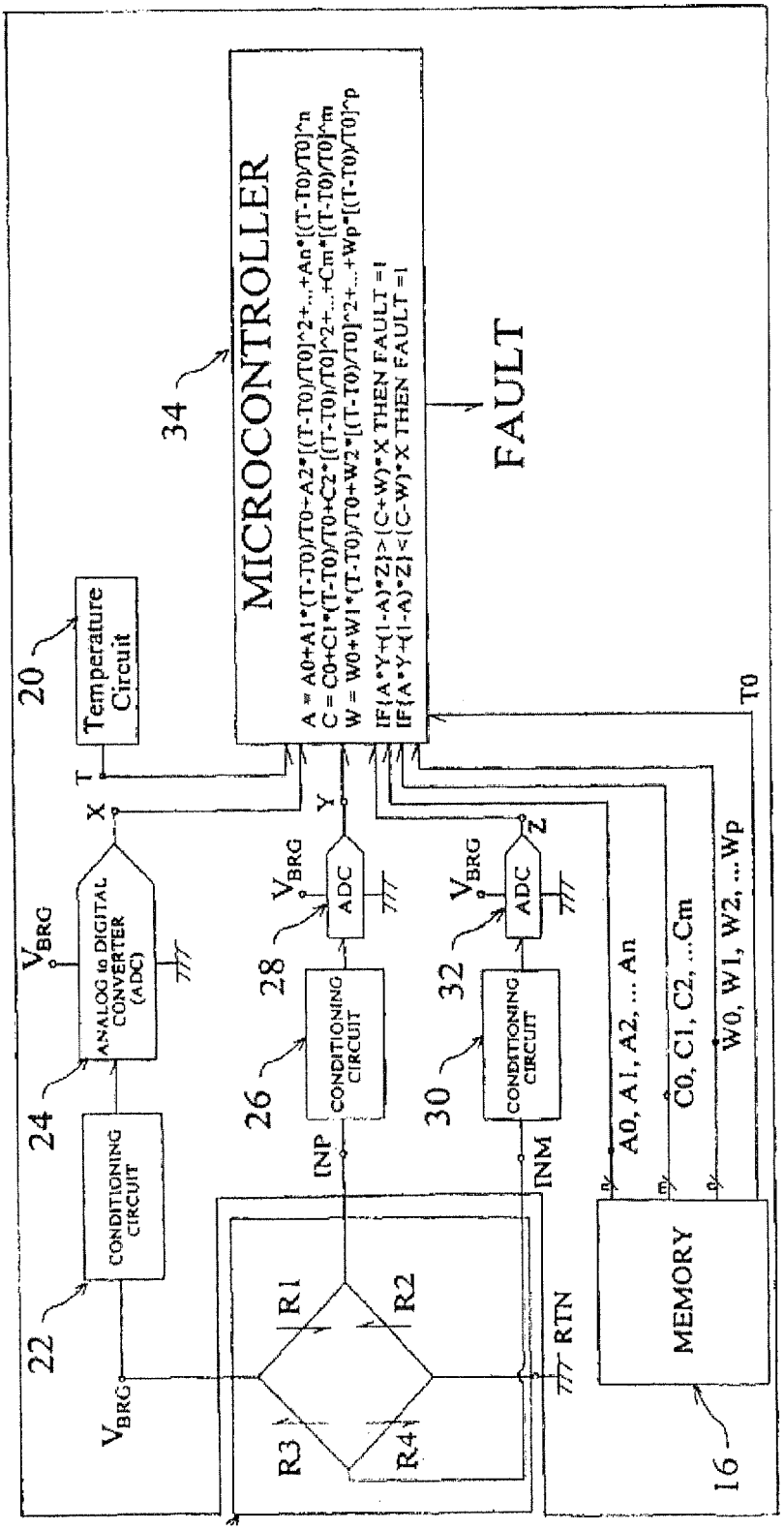

In a difference measurement circuit according to embodiments of the present invention, for example a difference measurement circuit for measuring the output signal of a sensor unit for example implemented as an impedance bridge such as a Wheatstone bridge, by combining two known methods for excitation (voltage-mode excitation and current-mode excitation) with two known methods for sensing (voltage-mode sensing and current-mode sensing), four readout methods can be identified. This is illustrated in case of a 4-impedance bridge configuration in FIG. 2.

In nearly all prior art approaches, excitation and sensing both in voltage-mode is applied. Also, readout of bridge-elements when frequency-dependent impedances are involved often makes use of sinusoidal excitation sources. This is because sinusoidal excitation will lead to a sinusoidal response, and by sensing the amplitude and phase of the measured response (relative to the excitation) a measure of the complex-valued bridge transfer is obtained. For fixing the mind, it is initially assumed that measurements are done at a frequency $\omega/2\pi$. The associated voltage-mode transfer in case of a 4-impedance bridge configuration (as in FIG. 1) is then:

$$T_{V \to V} = \frac{V_{sense}|_{I_{sense}=0}}{V_{ex}} = \frac{V_3(\omega)}{Z_3(\omega) + Z_2(\omega)} - \frac{Z_4(\omega)}{Z_1(\omega) + Z_4(\omega)}$$

With the general definition for imbalance:

$$\delta_{i,j} = \frac{Z_i(\omega) - Z_j(\omega)}{Z_i(\omega) + Z_j(\omega)}$$

this can be rewritten as (Eq. 1):

$$T_{V \to V} = \frac{\delta_{1,4} + \delta_{3,2}}{2}$$

Eq. 1 has a very important interpretation. It shows that the voltage transfer is the average value of two imbalances: $\delta_{1,4}$ which is the imbalance of the left half-bridge, and $\delta_{3,2}$ the imbalance of the right half-bridge. In the most general situation, $\delta_{i,j}$ can be frequency-dependent and complex-valued. In this case, Eq. 1 represents a relation between a measurement in sine-regime and two complex-valued imbalance parameters. However, it is instructive to see that for the most frequently appearing sensor types, the imbalance parameters are actually independent of the measurement-frequency and assume real values:

| | General | resistive | capacitive | Inductive |
|---|---|---|---|---|
| $\delta_{i,j}$ | $\frac{Z_i(\omega) - Z_j(\omega)}{Z_i(\omega) + Z_j(\omega)}$ | $\frac{R_i - R_j}{R_i + R_j}$ | $\frac{C_j - C_i}{C_j + C_i}$ | $\frac{L_i - L_j}{L_i + L_j}$ |

In these frequently occurring cases, the bridge transfer Eq. 1 is also real and frequency-independent. This implies that the transfer can be measured with other excitation waveforms and with any convenient frequency. Hence, the sinusoidal excitation source can be replaced with a signal source which is easier to realize with electronic hardware. This includes for example square-wave, triangle, step-wise, . . . excitation waveforms. The response then has the same form as the excitation waveform, but scaled with a simple scale-factor (which corresponds to the bridge transfer). In case of the impedances being simple resistances, DC excitation sources may be used, and DC signals may be measured. Because the actual frequency and/or the applied waveform is not of primary importance for the invention, hereinafter, for the purpose of describing the invention, often reference will only be made to the "excitation" and "sensing" part of the circuits, without referring to the actual type and frequency of excitation and sensing signals.

One of the advantages of the voltage transfer is that it does not depend on absolute impedance levels, but only on dimensionless imbalance parameters. This also applies for the current transfer, which can be developed in an analogous way (Eq. 2):

$$T_{I \to I} = \frac{I_{sense}|_{V_{sense}=0}}{I_{ex}} = \frac{\delta_{1,2} + \delta_{3,4}}{2}$$

Here, the result is the average imbalance of the top and bottom half bridges.

Other options for measuring the bridge transfer are voltage-sensing in combination with current-excitation, or current-sensing with voltage-excitation. When it comes to measuring the bridge imbalance in an accurate way, these hybrid measurement techniques are less favorable because the transfers involved also depend on absolute impedance levels. This poses mainly problems when these absolute impedance levels depend on secondary environmental conditions, for instance the temperature of the sensor. This is often the case in a piezoresistive pressure sensor, where the sensor resistances typically vary with temperature. When such secondary dependencies are less prominent, hybrid measurement approaches might still be useful. As an example, capacitance-based sensors are mentioned. Here, the sensing capacitances have in many cases a very low temperature-dependency. Therefore, all four identified readout methods have potential for readout of a sensor unit and can be found in different embodiments of the present invention.

Also "intermediate" readout approaches exist, which are neither purely voltage-mode nor purely current-mode. For instance, the excitation voltage $V_{ex}$ is often applied with an explicit output impedance (which is in series with the complete impedance bridge). Such explicit series impedances are then for instance inserted with the intention of temperature-compensation of the sensor sensitivity. Also, a loading impedance at the sensing side might be of importance. Here, the actual category (voltage-sensing and current-sensing) depends on the relative size of this loading impedance as compared to the bridge impedance levels. In what follows, the idealized situations are considered, but it should be clear that techniques according to embodiments of the present invention can also be applied in those non-idealized situations, though not explained in detail hereinbelow.

An observation to make is that the values obtained by voltage-mode measurement (Eq. 1) and by current-mode measurement (Eq. 2) are not necessarily equal in value. Still, under perfectly matched conditions ($Z_3=Z_1$ and $Z_4=Z_2$), it is easy to show that all half-bridge imbalance values are identical ($\delta_{1,2}=\delta_{1,4}=\delta_{3,4}=\delta_{3,2}$) and the voltage-mode measurement (Eq. 1) and the current-mode measurement (Eq. 2) are exactly equal. Therefore, under normal conditions—that is when mismatch between matched sensor elements is within normal process limits—the values are nearly identical. Having now two alternative measurements for the bridge imbalance provides a method for redundancy testing: one alternates between voltage-mode and current-mode transfer measurements, and subsequently tests whether the readout values are close enough, i.e. are lying within a pre-determined window. Translated in mathematical terms, this test-condition is equivalent to (Eq. 3)

$$\delta_{1,2}+\delta_{3,4}-\delta_{1,4}-\delta_{3,2} \approx 0$$

By comparing test-equations, one can infer that this method for redundancy-testing is fundamentally different from the test used e.g. in EP1111344.

Figure 7:
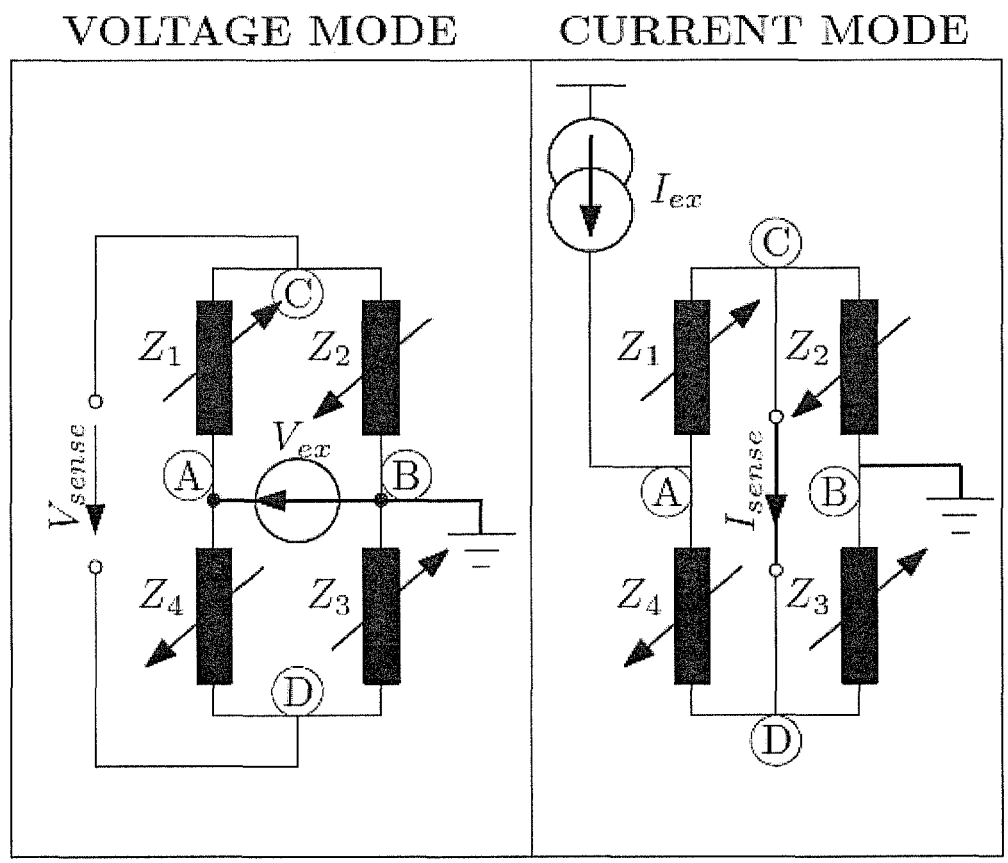
FIG. 7 illustrates that alternative readout approaches can be obtained by exchanging excitation and sensing nodes in accordance with embodiments of the present invention, while doing a same measurement as before.

It is to be noted that this redundancy-test does not reduce the measurement bandwidth, since each measurement provides a readout of the bridge imbalance. There is, however, one disadvantage of such an approach: it requires hardware that can deal with the two different readout approaches voltage mode versus current mode). Fortunately, in accordance with embodiments of the present invention, there is also a way to do both these measurements either only in voltage mode, or only in current mode. This can be done in accordance with embodiments of the present invention by exchanging excitation and sensing, as illustrated in FIG. 7. The rest of the readout circuitry remains unaltered. It is easy to show that now the voltage-mode transfer is the same as in (Eq. 2), and the current-mode transfer becomes the right-hand side of (Eq. 1). The action of exchanging excitation and sensing can also be viewed as rotating the bridge 90°.

Figure 8:
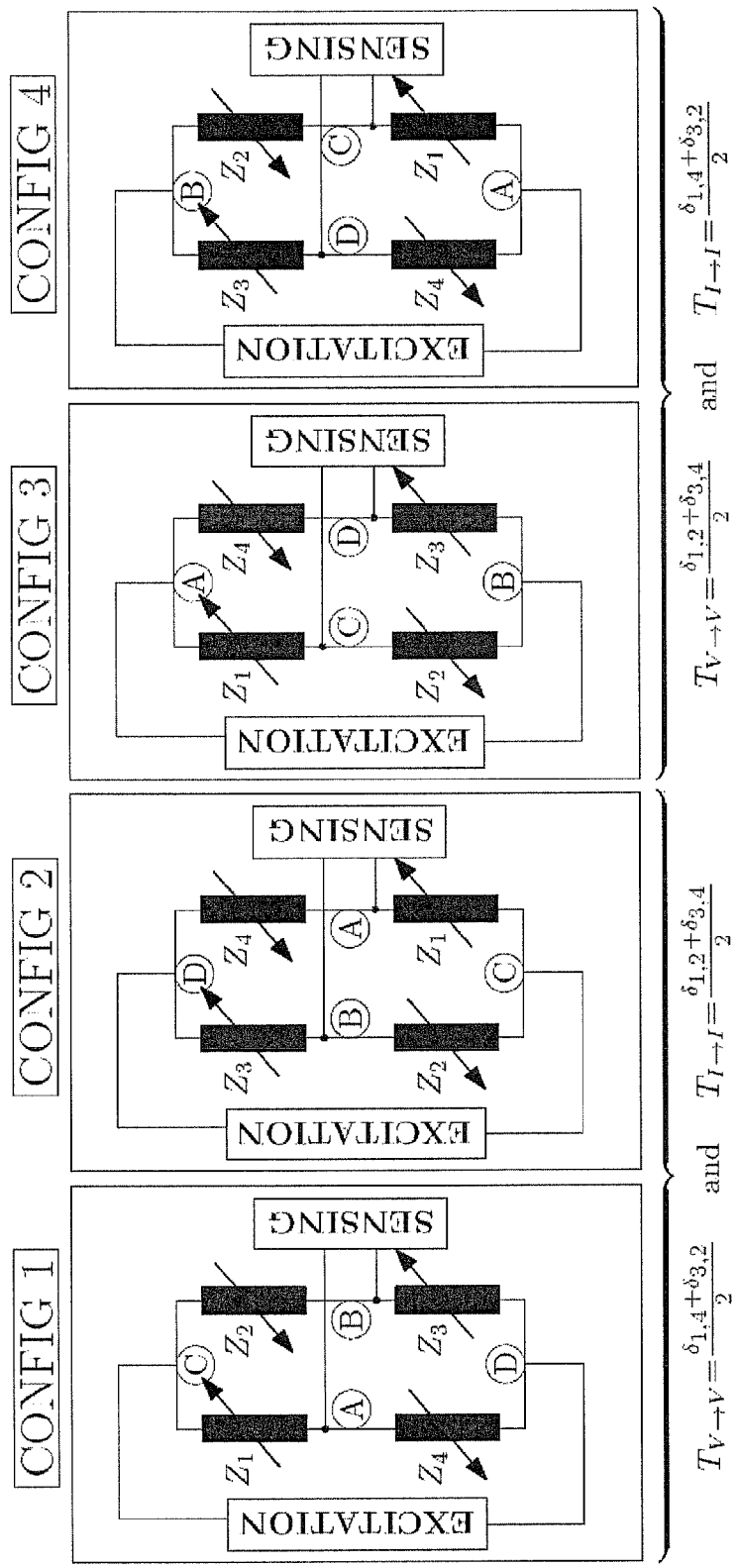
FIG. 8 shows four bridge configurations corresponding to dynamic reconfiguration (rotation and/or flip-over) in accordance with embodiments of the present invention, which have same nominal output signals. By dynamically changing the bridge-to-readout connections in accordance with embodiments of the present invention, redundancy-related information can be gathered.

Embodiments of the present invention are applicable in general to any type of sensor unit where the sensor has a symmetry which allows different configurations of excitation and sensing to lead to a same readout. As a particular example, FIG. 8 illustrates four possible configurations for readout of an impedance bridge with two matched pairs $Z_1|Z_3$ and $Z_2|Z_4$. In case of perfect matching ($Z_1=Z_3$ and $Z_2=Z_4$), it can be seen that indeed each configuration leads to a same readout value when the same readout method is applied (e.g., based on either a voltage-mode measurement technique, or on a current-mode measurement technique). Important is that only the access ports P1, P1' and P2, P2' to the sensor unit (A, B, C and D) have been given different functions (either excitation or sensing). The internal structure of the sensor unit remains unaltered.

Embodiments of the present invention provide a difference measurement circuit for readout of a sensor unit. The sensor unit comprises a first set of nodes and a second set of nodes for excitation and for measurement of the sensor unit, for example an impedance bridge. The difference measurement circuit according to embodiments of the present invention comprises a first port and a second port for connection to the first set of nodes and the second set of nodes of the sensor unit. The difference measurement circuit furthermore comprises switching units for switching excitation signals from being applied to the first set of nodes, via the first port, to being applied to the second set of nodes, via the second port, and for switching measurement signals from being obtained from the second set of nodes, via the second port, to being obtained from the first set of nodes, via the first port.

In the following detailed description, a few particular examples of difference measurement circuits according to embodiments of the present invention and their operation are set out. In these, as examples 4-element impedance bridge configurations are illustrated; however, as stated before, the present invention is not limited thereto, but is applicable in general to any type of difference measurement bridge circuits where the sensor has a symmetry which allows different configurations of excitation and sensing to lead to the same readout.

Embodiments of the present invention provide a difference measurement circuit 60 which is provided with a first port P1, P1' for accessing a first set of nodes A, B and a second port P2, P2' for accessing a second set of nodes C, D for excitation and measurement of a sensor unit. In the embodiment illustrated, the sensor unit comprises four impedances $Z_1$, $Z_2$, $Z_3$, $Z_4$ in a bridge 69 configuration. The first set of nodes A, B are opposite nodes of the bridge 69, each between two impedances, and the second set of nodes C, D also are opposite nodes of the bridge 69, each between two impedances. The first and second sets of opposite nodes A, B, C, D are for excitation and measurement of the impedance bridge 69. The measurement circuit 60 according to embodiments of the present invention further comprises switching units 61, 62 for switching excitation signals from being applied to the first set of nodes A, B to being applied to the second set of nodes C, D, and vice versa, and for switching measurement signals from being obtained from the second set of opposite nodes C, D to being obtained from the first set of opposite nodes A, B, and vice versa. This switching of excitation and measurement signals between nodes is also called a bridge-rotating technique according to embodiments of the present invention. This means that in accordance with embodiments of the present invention, at a particular moment in time, the first set of nodes A, B may be used for excitation of the sensor unit 69, while the second set of nodes C, D may be used for measurement thereof. At another moment in time, the first set of nodes A, B may be used for measurement, while the second set of nodes C, D may be used for excitation of the sensor unit 69.

Figure 9:
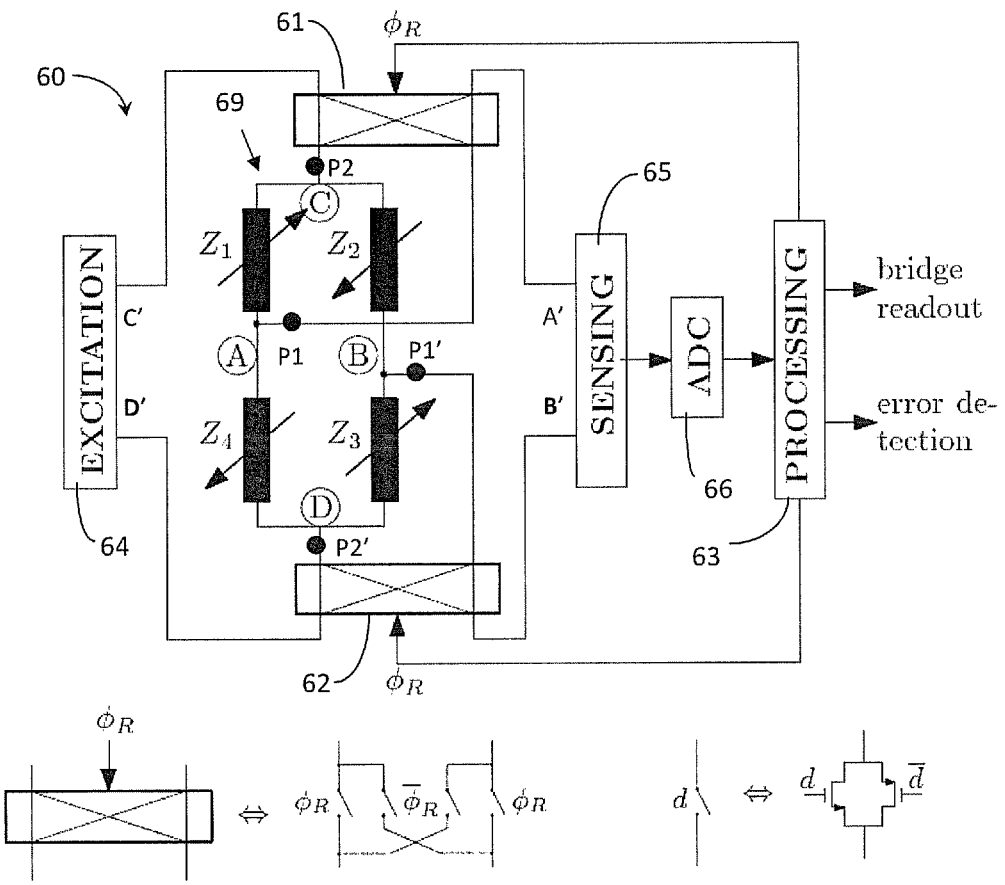
FIG. 9 illustrates an implementation of a difference measurement circuit according to embodiments of the present invention, where exchanging excitation and sensing in an impedance bridge is implemented by means of two choppers controlled by a same control signal $Ø_R$.

One implementation of a difference measurement circuit 60 according to embodiments of the present invention is shown in FIG. 9. This implementation makes use of two switching units 61, 62 which are controlled by a common (e.g. digital) control signal $Ø_R$. The control signal $Ø_R$ may be generated by a control unit, e.g. processor 63.

The switching units 61, 62 may be choppers, which each comprise four fast electronic switches, and where each electronic switch may for example be implemented as a transistor circuit, such as e.g. an NMOS transistor, a PMOS transistor, or a parallel combination of these. Depending on the value of the control signal $Ø_R$, the switching units 61, 62 either connect through or introduce a cross-connection. When the switching units 61, 62 provide a through-connection, an excitation signal generated at excitation nodes C', D' by excitation circuitry 64 is applied via the second port P2, P2' of the difference measurement circuit 60 to the nodes C and D of the sensor unit 69, while sensing is done by sensing circuitry 65 at sensing nodes A' and B' which are connected through the switching units 61, 62 through the first port P1, P1' to nodes A and B of the sensing unit 69. When the switching units 61, 62 cross-connect, the excitation signal generated by excitation circuitry 64 at excitation nodes C', D' is applied through the first port P1, P1' to nodes A and B of the sensing unit 69, while sensing occurs now by sensing circuitry 65 sensing signals at sensing nodes A', B' thereof, which are connected through the second port P2, P2' of the difference measurement circuit 60 to nodes C and D of the sensing unit 69. Hence, the control signal $Ø_R$ determines the actual bridge configuration for each measurement.

A processor 63, in the example illustrated the same processor which also provides the control signal $Ø_R$ but the invention not being limited thereto, may be provided for collecting subsequent readout values obtained, and for extracting a true bridge output.

In particular embodiments, in order to allow processing of the readout values by the processor 63 in the digital domain, the difference measurement circuit 60 may furthermore be provided with an A/D converter 66 for A/D conversion of the measurement signals obtained by the sensing circuitry. In this case, advanced (e.g. model based) processing techniques can be applied more easily. It is also possible that the sensing circuitry 65 (used for readout of the sensor unit) is merged with the A/D conversion circuitry 66 into a unit which performs both functions simultaneously.

By allowing the bridge configuration to be controlled directly by the control unit, e.g. processor 63, (adaptive) system identification can be used to maximize the information extracted from the measurements.

Extracting the true bridge output may include some post-processing operations, such as for example averaging or filtering. The control unit, e.g. processor 63, can also signal an error-condition, e.g., when the deviations between measurements obtained for different control signals $\emptyset_R$ become too large.

$\emptyset_R$ is a bi-level control signal which determines which configuration is used during the measurement. $\emptyset_R=+1$ will be taken for a first configuration, and $\emptyset_R=-1$ for the alternative configuration obtained by a 90° rotation of the first configuration (which e.g. correspond actually to configurations 1 and 3 in FIG. 8). At each sample instant the output of the measurement system is:

$$D_{out} = \begin{cases} \frac{\delta_{1,2} + \delta_{3,4}}{2} & \text{if } \emptyset_R = +1 \\ \frac{\delta_{1,4} + \delta_{3,2}}{2} & \text{if } \emptyset_R = -1 \end{cases}$$

It is easy to show that this is equivalent to (Eq. 4):

$$D_{out} = \underbrace{\frac{\delta_{1,2} + \delta_{3,4} + \delta_{1,4} + \delta_{3,2}}{4}}_{\text{average imbalance: } \delta_{readout}} + \underbrace{\frac{\delta_{1,2} + \delta_{3,4} - \delta_{1,4} - \delta_{3,2}}{4}}_{\text{redundancy test: } \delta_{test}} \cdot \emptyset_R$$

hence $$D_{out} = \delta_{readout} + \delta_{test} \cdot \emptyset_R$$

In this, $\delta_{readout}$ is the average imbalance of the different halfbridges, and therefore corresponds with the sensor readout to be obtained, while $\delta_{test}$ should be nearly zero under normal conditions (when the sensor has matched pairs).

In its easiest form, control signal $\emptyset_R$ toggles at a fixed rate, which means that both types of measurements are constantly alternated. However, other strategies are possible, e.g., pseudo-random toggling.

In order to fully understand the bridge-rotation technique according to embodiments of the present invention, one must be aware of the fact that the redundancy-test is based on comparing values obtained at different sample instants. For measurement systems with sufficient oversampling, the technique can be implemented by direct comparison of subsequent values. When the system is strongly oversampled, it can be assumed that subsequent samples of the readout-related signal $\delta_{readout}$ are equal. In this case, it makes sense to toggle $\emptyset_R$ at the maximum rate. Hence if at time $t_1$ $\emptyset_R=+1$ has been used, $\emptyset_R=-1$ is taken at the next sample instant. The two subsequent measurements are therefore:

$D_{out}(t_1)=\delta_{readout}+\delta_{test}$ $D_{out}(t_1+T)=\delta_{readout}-\delta_{test}$ The difference between both sample outputs provides therefore information on the reliability of the sensor $$\delta_{test} = \frac{D_{out}(t_1) - D_{out}(t_1 + T)}{2}$$

For systems with sample rates (frequency of readout of the difference bridge) closer to the Nyquist rate, there is the possibility that changes are actually caused by the physical signal to be measured, with a false detection as possible outcome. In this case, a solution can be found in changing $\emptyset_R$ in a more random way—e.g. pseudo-randomly or randomly, and independent from the physical signal. When sampling is done at a rate close to the Nyquist rate, the signal to be measured ($\delta_{readout}$) can change significantly from sample to sample. It then becomes more difficult to extract the test-value. This can, however, still be done in a statistical way.

If $D_{out}=\delta_{readout}+\delta_{test} \cdot \emptyset_R$ is multiplied with $\emptyset_R$, and using $\emptyset_R^2=1$, the following is obtained:

$\delta_{test}=D_{out}\emptyset_R-\delta_{readout}\emptyset_R$

It is to be noted that $\delta_{test}$ should remain close to zero at all times, even when the physical signal changes. In the ideal situation, the sensitivity of $\delta_{test}$ with respect to signal-changes is zero. In case something goes wrong with the sensor, $\delta_{test}$ will become non-zero. Under such mismatch conditions, $\delta_{test}$ will become somewhat dependent on the physical signal, but this is not very important since the only aim is to detect the error condition.

The basic idea is to let $\emptyset_R$ take on random values independent of the physical signal, and with zero mean value. If the expectation of the pseudo-random toggling case is taken, the following is obtained:

$\delta_{test}=E[D_{out}\emptyset_R]-E[\delta_{readout}\emptyset_R]$

It is to be noted that here $\delta_{test}$ is the same as its expected value, because it is a quantity independent of the measurement-configuration used. Also because of independence, $E[\delta_{readout} \cdot \emptyset_R]=E[\delta_{readout}] \cdot E[\emptyset_R]$, which is zero because the mean $E[\emptyset_R]$ is taken zero. Therefore, $\delta_{test}=E[D_{out}\emptyset_R]$ For the practical test, expectations need to be replaced by some kind of averaging over time.

In summary, the redundancy test in accordance with embodiments of the present invention may then be performed as follows. The digital control unit 63 generates a binary zero-mean pseudo-random signal $\emptyset_R=\pm 1$, which is used to set the configuration of the next measurement. The resulting digital output $D_{out}$ of the measurement system is then multiplied by $\emptyset_R$. This signal is then averaged over time (or alternatively lowpass filtered in the digital domain). The time interval over which to average (or the filter cutoff bandwidth) needs to be judiciously selected. On the one hand, with short averaging periods, statistical variations might lead to false error triggers. On the other hand, long averaging times introduce a larger delay in detecting error situations in case they occur.

Figure 10:
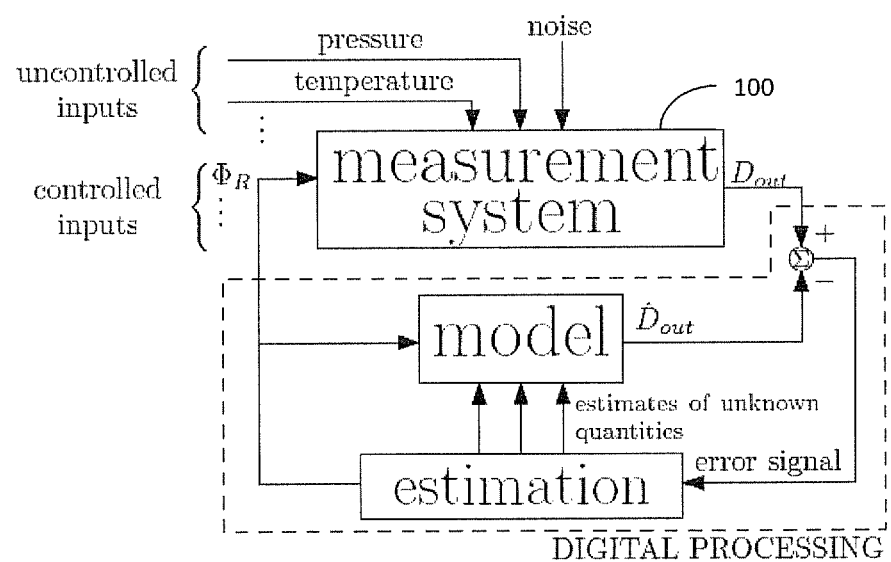
FIG. 10 illustrates a measurement system according to embodiments of the present invention, having known and unknown inputs and outputs, and a simulatable model of the measurement system being used to obtain a predicted output, the simulatable model using the same controlled inputs and using estimates of the unknown quantities

In particular embodiments of the present invention, more advanced (e.g. model based) processing techniques can be used. For setting the mind, the sensor unit, e.g. impedance bridge 69, and the difference measurement circuit 60 according to embodiments of the present invention may be considered together as a system-level black box 100 (as illustrated in FIG. 10). This system has some inputs over which the user does not have any control: these are for instance the physical excitation to be measured (e.g., a pressure), the actual sensor mismatch parameters, temperature, . . . . There is also noise as unknown source: electronic noise, but also pseudo-random noise sources like quantization noise can be included. Next to these unknown signals, inputs are distinguished over which the user has full control. These are for instance the configuration signal $\emptyset_R$ used in the difference measurement circuit 60.

The difference measurement circuit 60 is in reality not at all a black box: it represents the measurement system that is being designed in accordance with embodiments of the present invention. A fairly good model of the readout operation can therefore be built. An example of such a model is $$D_{out} = \delta_{readout} + \delta_{test} \cdot \emptyset_R$$

where $\delta_{readout}$ and $\delta_{test}$ are as specified in Eq. 4. It shows that the digital output $D_{out}$ depends on $\delta_{readout}$ (which on its turn depends on the physical input signals), but it also details how mismatch and configuration signal $\emptyset_R$ affect this output. It has already been described how statistical estimation techniques can be used to extract information about the real measurement system. Here, these techniques are put in a more general setting: they are cast into a framework where (adaptive) estimation theory can be applied (e.g., Kalman filtering). It is clear that the model used can be expanded to include more (parasitic) effects, and can also be dynamic.

In essence, the bridge-rotating technique according to embodiments of the present invention requires only a small number of switches, e.g. on-chip switches, comprised in the switching units 61, 62 and is therefore very simple with respect to added hardware. The readout approach deviates from the traditional readout methods in an important aspect. As noted with respect to FIG. 2, the traditional excitations use a fixed ground-connection at the bottom bridge node. This is obviously not possible in the new approach. Here, the ground-connection used in the traditional voltage-mode and current-mode excitations will be applied either to node D or node B, depending on the control signal $\emptyset_R$. In other embodiments of the present invention (as for example illustrated in FIG. 11), even more bridge reconfigurations are implemented, which imply that any of the four bridge nodes can be assigned the function of ground reference.

Figure 11:
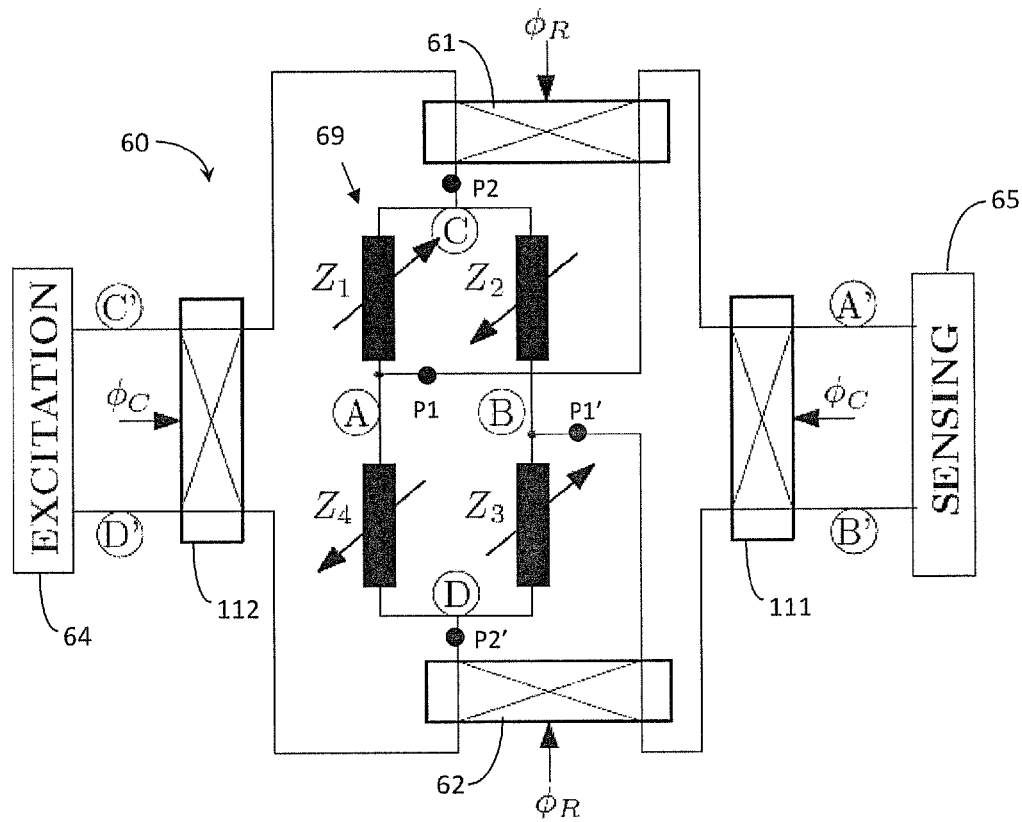
FIG. 11 illustrates a sensor bridge in a difference measurement circuit according to embodiments of the present invention, comprising capabilities for dynamic reconfiguration of the sensor bridge, including rotation and flip-over.

The embodiment of FIG. 11 not only allows to rotate the bridge 69, it also allows a top-to-bottom flip-over of the bridge 69. Two additional choppers 111, 112 driven by a same signal $\emptyset_C$ can be used for this purpose. An equivalent functionality with respect to the dynamic reconfiguration of the connections to the sensor unit can be obtained by means of a switch matrix (also shown in FIG. 12). By closing all switches with a same label, the four configurations shown in FIG. 8 can be obtained.

Figure 22:
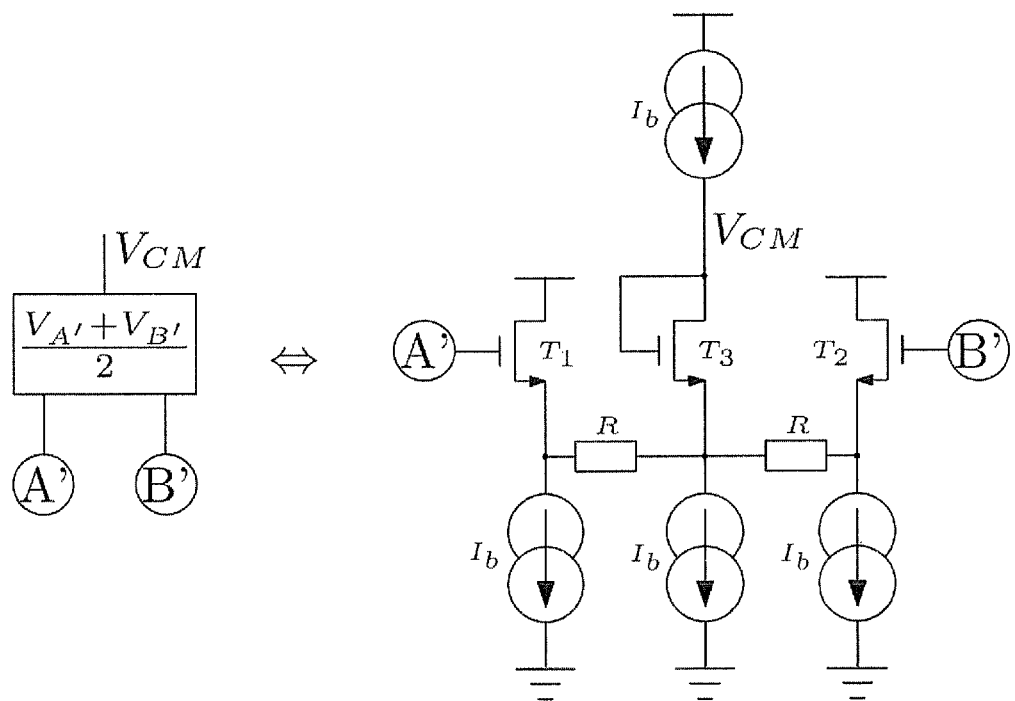
FIG. 22 illustrates one embodiment of a circuit that may be used to extract the common-mode voltage of sensing nodes of a sensor unit.

In at least some of the above embodiments, the implemented redundancy test comprises evaluating the similarity or deviation of the differential measurement signals obtained in different states of the switching units (61,62). Therefore, these embodiments re-use measurement signals obtained by circuits which are already needed for readout of the sensor. In other embodiments of the present invention, the redundancy test might be based on other measurement signals, preferably but not limited to measurement signals obtained by circuitry which is already present for other purposes. An example of such an approach (not illustrated) reuses circuits which extract the voltage and/or the current of the excitation source at excitation nodes C', D'. Such kind of circuits are sometimes used for extracting information related to environmental conditions (e.g., temperature) which may affect the sensor readout. In another embodiment of the present invention, the redundancy test is base on evaluating the similarity or deviation of a measurement of a linear combination of voltages at the sensing nodes A', B' and/or at the excitation nodes C', D' (not illustrated). As a particular example, the common-mode voltage of the sensing nodes A', B' is mentioned, which can for instance be extracted by means of a simple circuit as illustrated in FIG. 22. However, if it is desired to convert this measurement to the digital domain, an extra A/D conversion is needed solely for implementing the redundancy test. Therefore, these embodiments have not been detailed here. However, in subsequent embodiments it will be demonstrated that by setting up a feedback loop that stabilizes the linear combination of voltages at the sensing nodes A', B' and/or at the excitation nodes C', D', the useful redundancy-related information can be extracted at the excitation nodes C', D'. As mentioned before, this allows in many case the reuse of hardware which is already present, such as for example an ADC. In yet alternative embodiments, the useful redundancy-related information can be extracted at still other nodes which in some cases allow to re-use hardware which is already present.

Until now focus has been laid on how a single redundancy test (as for instance Eq. 3) can be implemented. In accordance with embodiments of the present invention, a bridge readout system for a difference measurement circuit 60 according to embodiments of the present invention may be provided which includes a full redundancy check. It extensively uses the dynamic bridge reconfigurations in accordance with embodiments of the present invention. However, the approach also relies on a new type of excitation, which will be referred to as a "symmetrical sensor excitation". It is particular in this approach that instead of a single excitation source, at least two excitation sources are used, each connected to a different node of the sensor unit. For the purpose of applying a voltage-mode excitation, both sources are voltage sources, while for the purpose of applying current-mode excitation, both sources are current sources.

Figure 13:
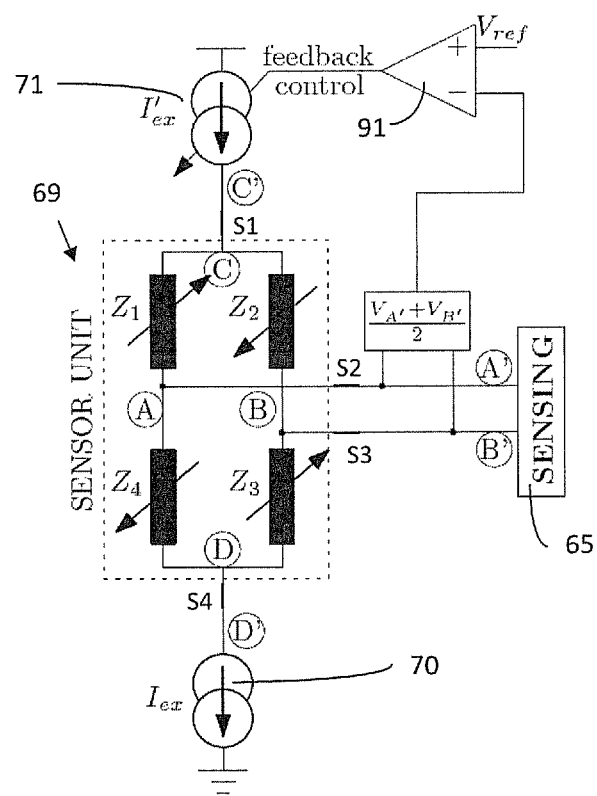
FIG. 13 illustrates a symmetrical excitation technique according to embodiments of the present invention, using two current sources for excitation of an impedance bridge, wherein the current sources are made equal by means of a feedback loop.

In embodiments which use current sources as a means for realizing a "symmetrical sensor excitation", the sensor unit 69 is excited by two current sources 70, 71, each connected to a different node of the sensor unit 69. For sake of ease, the current sources 70, 71 are illustrated in FIG. 13 as providing excitation signals to the set of sensor nodes C, D, while the sensor nodes A,B are used for sensing. This corresponds to one particular configuration of the sensor excitation and readout. The connection to these particular nodes, hence the particular configuration, is implemented by means of the switching units 61, 62, provided, which in their particular combination provide switches illustrated in FIG. 13 as switches S1, S2, S3 and S4. However, as a difference measurement circuit 60 according to embodiments of the present invention is provided with switching units 61, 62 for switching excitation signals from being applied to the first set of nodes A, B to being applied to the second set of nodes C, D and vice versa, the current sources 70, 71 could as well be illustrated as providing excitation signals to the set of opposite nodes A, B. An analogous remark applies with respect to the sensing nodes used by the readout circuit.

Because two independent current sources are never perfectly equal, a feedback loop may be used to obtain such equality. There are some options to choose at which point the feedback current source is inserted in the system. As shown in FIG. 13, one of the current sources (here the top current source 71) can be completely controlled by the feedback loop. In this case, the first current source 70 is an independent current source, and the second current source 71 is a controlled current source, e.g. a voltage controlled current source. It is, however, also possible to split the second current source 71 into an independent source in parallel with an adaptable one (not shown). There are also a number of ways to define the feedback loop. A fairly easy approach is to observe a voltage related to the sensor unit 69, and stabilize this voltage to a constant value $V_{ref}$. The actual voltage that is stabilized can be any of the four voltages at the excitation nodes and/or the sensing nodes: $V_{A'}$, $V_{B'}$, $V_{C'}$ or $V_{D'}$. It can also be a weighted combination of these voltages. In the current embodiment and embodiments which follow, one particular combination will play a major role: the common-mode voltage $(V_{A'}+A_{B'})/2$ of the two sensing nodes. A simple circuit is used to extract the common-mode voltage of the sensing nodes A' and B'. An example of such a circuit is shown in FIG. 22. It comprises NMOS voltage buffers $T_1$ (resp. $T_2$) for buffering the voltage $V_{A'}$ (resp. $V_{B'}$), two nominally equal resistors for generating the common-mode level of the buffered voltages, and a diode-connected NMOS for compensating the threshold-related voltage drop of the buffers. The obtained common-mode voltage $(V_{A'}+A_{B'})/2$ of the sensing nodes is then compared to a reference value $V_{ref}$ in an amplifier 91. The comparison signal may be used as such or may be amplified, and then the resulting control signal $V_{control}$ may be used to control the adaptable current source 71 so as to adjust the second current source 71 such that it delivers a same current as the first current source 71. The combination of the amplifier and adaptable current source or sources could also represent an amplifier with a current output (or multiple current outputs).

It is important to understand that the above principle not only applies to DC current sources (which would be appropriate for readout of a resistive bridge), but also works if the independent source produces more complex waveforms like sinusoidal, square-wave or step-wise excitations.

Figure 14:
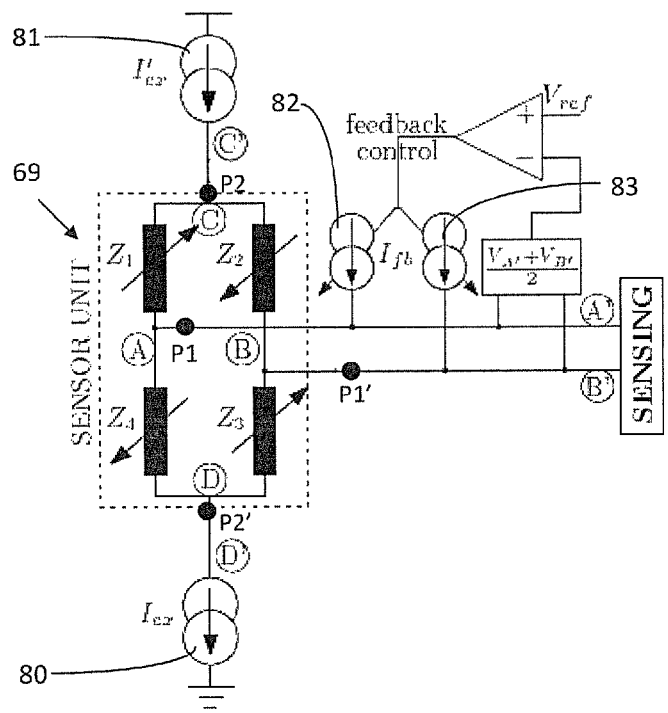
FIG. 14 illustrates a symmetrical excitation technique according to embodiments of the present invention, using two current sources for excitation of an impedance bridge, wherein the two current sources are fixed, but two matched current sources deliver directly to the bridge output nodes the small current-difference which might exist between the two fixed current sources.

In some cases, especially when additional parasitic effects are present, the solution as described with respect to FIG. 13 leads to problems with the feedback loop, e.g., with respect to stability, speed and/or accuracy. Such problems may for example be overcome by a solution according to embodiments of the present invention as shown in FIG. 14. In the solution illustrated in FIG. 14, two independent sources 80, 81 are used at the top and the bottom of the impedance bridge 69, and two small adaptable sources 82, 83 that bypass the bridge 69 are added. Here, the feedback loop will set the adaptable sources 82, 83 to a value which corrects the inevitable small current differences between the fixed sources 80, 81. Depending on the particular design constraints, the embodiment illustrated in FIG. 14 might be a better solution than the embodiment illustrated in FIG. 13.

Figure 15:
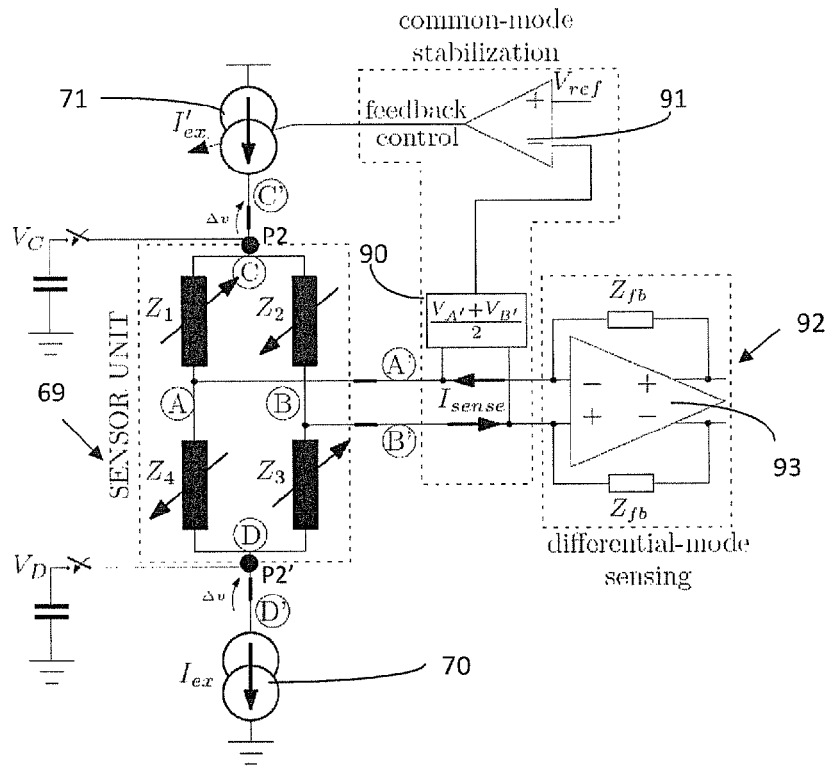
FIG. 15 is a conceptual representation of a symmetrical excitation readout system according to embodiments of the present invention, with explicit common-mode and differential-mode feedback loop.

It is to be noted that FIG. 13 and FIG. 14 only describe the operation principle of the loop. This is all that is needed currently for explaining the rest of the system. However, it should be understood that the actual feedback loop can also deal with (mostly unwanted) interactions with other parts of the readout system. For instance, when a differential-mode readout circuit 92 is added to the system (as shown in FIG. 15), its common-mode behavior interacts with the feedback loop. Therefore, the actual implementation of the feedback loop can take on a different form. The main feature needed here is the action as a nullor: it is assumed that the feedback loop effectively stabilizes the common-mode level of the sensing nodes A', B' to a constant value. A nullor represents an ideal amplifier having infinite current, voltage, transconductance and transimpedance gain. In negative feedback circuits, the circuit surrounding the nullor determines the nullor output in such a way as to force the nullor input to zero. One way to obtain this is a feedback loop with high gain.

In the setup of FIG. 15, the fully differential amplifier 93 virtually shorts the bridge nodes A and B connected to the first port P1, P1', and senses the bridge current $I_{sense}$ through this virtual short. This corresponds to current-mode sensing of the bridge 69. Two feedback loops are now operating simultaneously: the current-feedback loop which drives $(V_{A'}+V_{B'})/2=V_{ref}$, and the bridge current-sensing circuit 92 which actively keeps the differential bridge output voltage zero, hence $V_{A'}=V_{B'}$. Therefore, two active nullors are provided whose combined action keeps the two sense node voltages $V_{A'}$ and $V_{B'}$ at a constant reference voltage $V_{ref}$.

It is now considered what the voltages of the other bridge nodes C, D are (the nodes connected to the second port P2, P2' where the current-excitation is applied). The top voltage is $$V_C = V_{ref} + (Z_1 \| Z_2) I_{ex}'$$

It is to be noted that $I'_{ex}=I_{ex}$, either because this is enforced by the feedback loop (as for instance in FIG. 15), or else because both sources have matched design values (when two independent sources are used, as for instance in FIG. 14). Because both $V_{ref}$ (the reference value to which the common mode value is compared) and $I'_{ex}=I_{ex}$ (the current value of the fixed current source 70) are constant bias values, the voltage $V_C$ provides direct information on the parallel impedance $Z_1 \| Z_2$. Likewise, $$V_D = V_{ref} - (Z_3 \| Z_4) I_{ex}$$

contains information on the parallel impedance $Z_3 \| Z_4$. These voltages are readily available, and can be extracted in a straightforward way. For instance, the voltages can be sampled with standard switched-capacitor techniques on a capacitor, and subsequently be converted to the digital domain by an ADC. The sampling instant can be optimized, for instance after sufficiently settling of the feedback loop (e.g., after a reconfiguration step). Also, for changing excitation waveforms, the sampling instants can be judiciously chosen, e.g., when $I_{ex}$ assumes a maximal value. It should be taken into account that the switches which are used for setting the readout configuration (e.g., the switches used in switching units 111,112, 61, 62) carry the (e.g. DC) excitation and/or sensing current. They will therefore introduce a voltage drop because of their finite conductance (see indication of Δv in FIG. 15). In many cases, the small loss in accuracy poses no problem, and the required voltages $V_C$ and $V_D$ could be sampled at the excitation nodes C' and D'. In other cases, when it comes to sensing voltages like the voltage $V_C$ at node C and the voltage $V_D$ at node D (as described above), nodes C and D being connected in the example illustrated to the second port P2, P2', it is advantageous to use separate switches that connect directly to the bridge nodes (C and D)—hence to the second port P2, P2'. Because voltage-sensing requires little to no current, the voltage drop can be avoided by using these separate switches.

Figure 16:
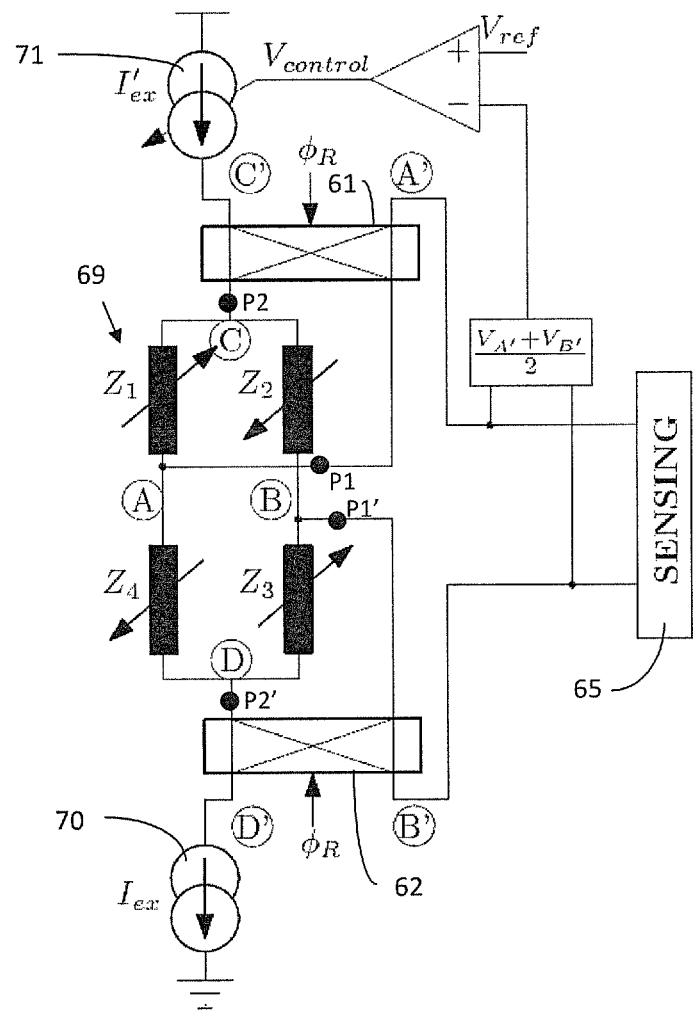
FIG. 16 illustrates an implementation of a difference measurement circuit according to embodiments of the present invention, where exchanging excitation and sensing in an impedance bridge is implemented by means of two choppers controlled by a same control signal $Ø_R$, the excitation being provided by means of two current sources made equal by means of a feedback loop.

In accordance with embodiments of the present invention, the amount of information gathered in configurations as described, with two current sources 70, 71 for symmetrical excitation of the bridge 69 can be increased by means of the dynamic bridge reconfiguration as set out in embodiments described above. One embodiment thereof is illustrated in FIG. 16. Hence, embodiments of the present invention include a difference measurement circuit comprising a first port P1, P1' and a second port P2, P2' for connection to a first set of nodes A, B and a second set of nodes C, D of a sensor unit. In the example illustrated, the sensor unit is implemented as a circuit comprising four impedances $Z_1$, $Z_2$, $Z_3$, $Z_4$ in a bridge configuration, the bridge 69 having a first set of opposite nodes A, B between impedances $Z_1$ and $Z_4$ on the one hand and $Z_2$ and $Z_3$ on the other hand, and a second set of opposite nodes C, D between impedances $Z_1$ and $Z_2$ on the one hand, and $Z_3$ and $Z_4$ on the other hand. The circuit further comprises switching units 61, 62, for switching excitation signals from being applied to the first set of opposite nodes A, B via the first port P1, P1' to being applied to the second set of opposite nodes C, D via the second port P2, P2' and vice versa, and for switching measurement signals from being obtained from the second set of opposite nodes C, D via the second port P2, P2' to being obtained from the first set of opposite nodes A, B via the first port P1, P1', and vice versa. The circuit also comprises excitation circuitry coupled to the switching units 61, 62, delivering an excitation signal for being applied to a set of opposite nodes of the bridge 69. In embodiments of the present invention, the excitation circuitry may comprise two excitation sources, for providing symmetrical excitation of the sensor unit. The excitation sources are coupled, via the switching units 61, 62 to one of the ports P1, P1' or P2, P2' of the difference measurement circuit according to embodiments of the present invention. These ports are each connected to a different set of nodes of the sensor unit 69. The excitation circuitry may for example comprise current sources. As a first example, the excitation circuitry may comprise an independent current source 70 and an adaptable current source 71 as illustrated in FIG. 13, where the adaptable current source 71 is controlled by a control signal $V_{control}$. Alternatively (not illustrated), the excitation circuitry may comprise two independent current sources 80, 81 and two small adaptable sources 82, 83 that bypass the bridge 69, as illustrated in FIG. 14. A feedback loop is provided to set the adaptable sources 82, 83 to a value which corrects the inevitable small current differences between the independent sources 80, 81.

The set of opposite nodes to which the excitation signal is applied, via one of the ports of the difference measurement circuit according to embodiments of the present invention, is determined by the setting of the switching units 61, 62, and hence can be either the set A, B or the set C, D. The switching units 61, 62 may be controlled by a control signal $\emptyset_R$ which toggles over time, for example at a fixed rate, pseudo-randomly or randomly, thus sequencing through two configurations.

It will now be shown that by sequencing through the two configurations (either in a systematic or a random way), enough data can be collected for a full redundancy check. As explained above, the voltages of the excitation nodes (depending on the setting of the switching units 61, 62 either A, B connected to the first port P1, P1' or C, D connected to the second port P2, P2') can be sampled, or the values can be obtained by any voltage-measurement method. In the first configuration the voltages $V_C$ and $V_D$ are obtained (expressions shown above). In the alternative configuration, when the switching units 61, 62 cross-link, the voltages $V_A$ and $V_B$ contain the following information:

$$V_A = V_{ref} + (Z_1 \| Z_4) I'_{ex}$$

$$V_B = V_{ref} - (Z_2 \| Z_3) I_{ex}$$

Even though an analog post-processing of these voltages is feasible, the maximum flexibility is obtained by converting these four voltages to the digital domain. Because $V_{ref}$ is assumed to be known, its contribution can be removed. Also, $I_{ex}$ and $I'_{ex}$ have at least the same nominal value, and sometimes the values are exactly equal because this is enforced by the feedback loop. Furthermore, the signal can be inverted to remove the negative sign in $V_B$ and $V_D$. Therefore, the following information is available for performing the redundancy test (Eq. 5):

$$\begin{cases} D_{12} = (Z_1 \| Z_2) I_{ex} / V_r \\ D_{34} = (Z_3 \| Z_4) I_{ex} / V_r \\ D_{14} = (Z_1 \| Z_4) I_{ex} / V_r \\ D_{23} = (Z_2 \| Z_3) I_{ex} / V_r \end{cases}$$

In this, $V_r$ is a known reference voltage used in the analog-to-digital conversion.

If, as in this embodiment, all data has been gathered in the digital domain, the post-processing steps can be implemented in a flexible and efficient way. This again opens up the way to advanced processing techniques like model-based system identification. Here, the algorithm applied can decide which bridge-configuration to use, and this way make a distinction between impedance variations due to the sensed (physical) signal, and variations due to mismatch. Such a more complex approach would be appropriate if the sensor operates substantially at Nyquist rate. In this latter case, the determination should preferably be done model-based: a model should be built, dealing with all relevant parameters, and statistics can be used to draw conclusions. In the model, each impedance, e.g. resistance, can be modeled in function of pressure, temperature, mismatch parameters and other parameters. The unknown parameters are estimated and reintroduced in the model to determine what the outcome is. Based on the outcome, an error signal may be generated, so as to generate new estimation values in an iterative process. However, because typically bandwidths are quite low compared to the sample rates that the readout circuits can realize, it can be assumed that the physical signals are mostly strongly oversampled and can be considered quasi-static. In this situation, the redundancy test is much easier to implement. The actual method is described next.

Because now all bridge-impedances are considered quasi-static, it can be assumed that the values obtained subsequently (by cycling through the different configurations) are as if they were sampled all at once. The post-processing block then uses the digital values $D_{12}; D_{34}; D_{14}$ and $D_{23}$ for evaluating the following test-values (Eq. 6):

$$\begin{cases} \delta_{test1} = \dfrac{D_{12} - D_{34}}{D_{12} + D_{34}} \\ \delta_{test2} = \dfrac{D_{14} - D_{23}}{D_{14} + D_{23}} \end{cases}$$

It will now be shown that these test-conditions are independent, and are both zero under matched conditions. Indeed, using Eq. 5 it can be seen that $$\begin{cases} \delta_{test1} = \dfrac{(Y_3 - Y_1) + (Y_4 - Y_2)}{Y_1 + Y_2 + Y_3 + Y_4} \\ \delta_{test2} = \dfrac{(Y_3 - Y_1) - (Y_4 - Y_2)}{Y_1 + Y_2 + Y_3 + Y_4} \end{cases}$$

where $Y_1, \ldots, Y_4$ denote the admittance of the bridge elements $Z_1, \ldots, Z_4$, respectively. Under matched conditions, $Y_3 = Y_1$ and $Y_4 = Y_2$, and both test-values are zero. Likewise, it is easy to deduce that $\delta_{test1} = \delta_{test2} = 0$ requires both $Y_3 = Y_1$ and $Y_4 = Y_2$ to be true. Hence, they are indeed independent conditions which act together as a full redundancy test. An interesting point is also that common scale factors are of no importance when evaluating Eq. 6. Therefore, the excitation current $I_{ex}$ and the reference voltage $V_r$ used by the ADC have no direct influence on the test. As a result, their values do not have to be known and slow (e.g., temperature-related) variations can also here be tolerated.

Figure 17:
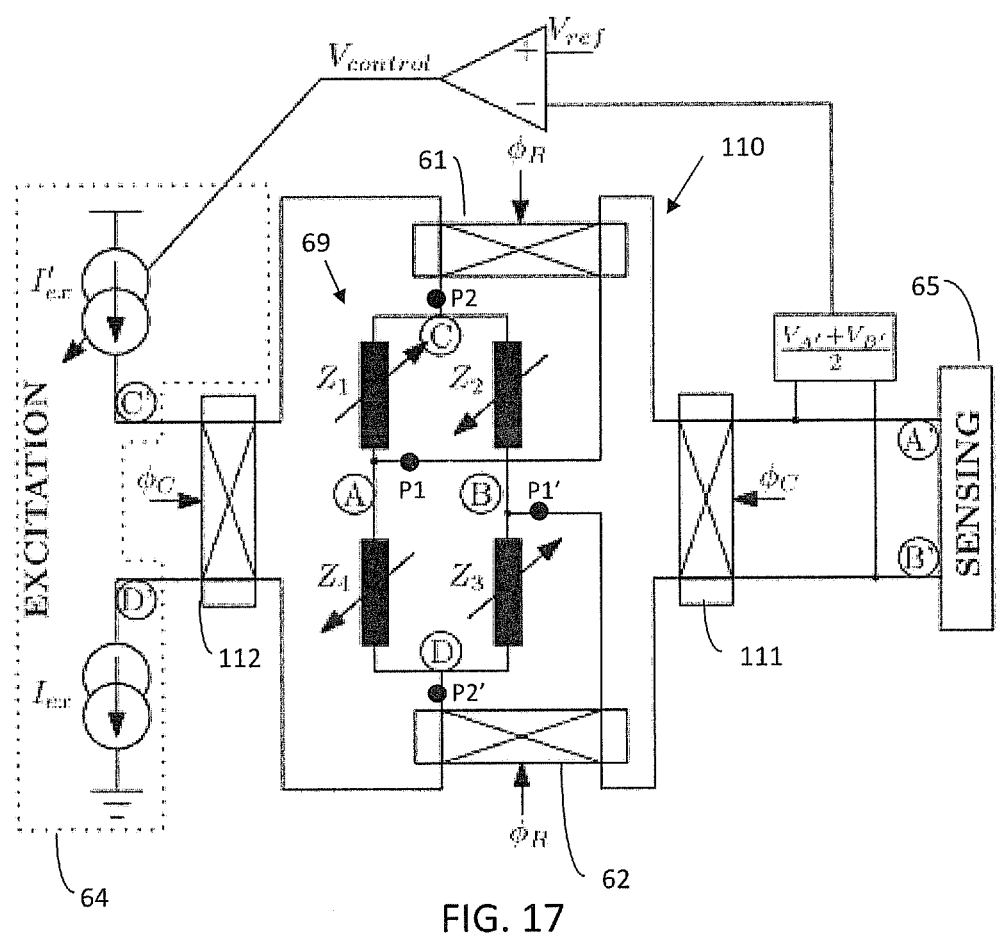
FIG. 17 illustrates a difference measurement circuit according to embodiments of the present invention, comprising capabilities for dynamic reconfiguration of a sensor unit, including rotation and flip-over, wherein a symmetrical excitation technique according to embodiments of the present invention is provided, using two current sources for excitation of an impedance bridge, the current sources being made equal by means of a feedback loop.

In accordance with embodiments of the present invention, as illustrated in FIG. 17, two additional switching units 111, 112, e.g. choppers, may be introduced to a difference measurement circuit 110 according to embodiments of the present invention, which additional switching units 111, 112 can simultaneously change the sign of the excitation and of the sensing, depending on a (possibly digital) control value $Ø_C$. This can also be viewed as applying chopping at the level of the bridge transfer. Yet another way to describe this, is as an up-side down flip-over of the bridge 69. Combining both reconfiguration methods, a system as shown in FIG. 17 is obtained. The main advantage of adding these extra configurations (obtained by flip-over of the bridge) is that now the digital information of Eq. 3 used in the full redundancy test can be obtained with differential circuits. These differential circuits have a much higher tolerance to noisy environments.

Figure 12:
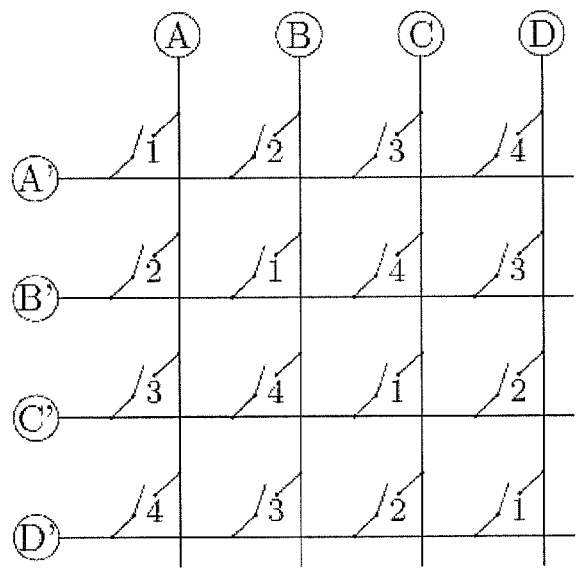
FIG. 12 shows a switch matrix illustrating an equivalent functionality with respect to the dynamic reconfiguration of the connections to the sensor bridge of FIG. 11.

One implementation of the system illustrated in FIG. 17 is with integrated electrical switches. Such an implementation has the drawback of having two switches in series. This increases the associated parasitic effects, like finite conductance of the switches. Other implementations which avoid the switches in series are certainly possible, such as using a switch-matrix as shown in FIG. 12.

Figure 18:
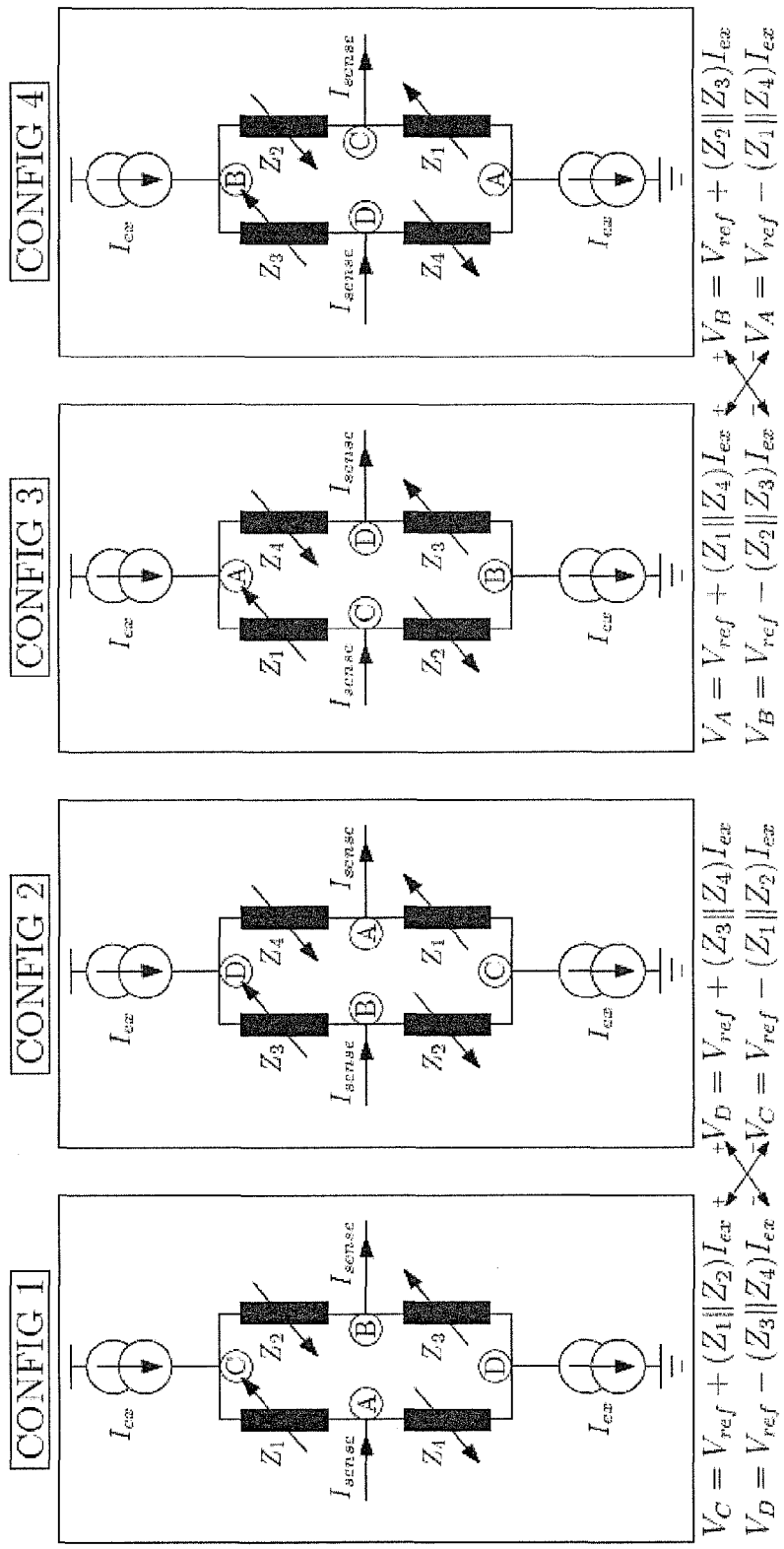
FIG. 18 illustrates four possible configurations obtained by a difference measurement circuit which includes capabilities for dynamic reconfiguration (rotation and flip-over of the bridge) according to further embodiments of the present invention.

Depending on the control signals $Ø_R$ and $Ø_C$, the bridge 69 as illustrated in FIG. 17 is configured in one out of four possibilities. These are shown in FIG. 18. Each of these configurations have under perfectly matched conditions exactly the same readout value for the bridge imbalance. Therefore, whatever the choice of configuration is, a sensor readout value is obtained. This implies that the readout bandwidth is not affected. Also, because in any case the sensor readout is based on a differential bridge, little effect on the sensor accuracy is expected. However, each configuration provides different information on the impedances that occur in the bridge. The voltages that contain this information are mentioned in FIG. 18, below each configuration.

It will now be shown that by sequencing through the four configurations (either in a systematic or a random way), enough data can be collected for a full redundancy check. As explained above, the voltages of the excitation nodes (depending on the setting of the switching units, either A, B connected to the first port P1, P1' or C, D connected to the second port P2, P2') can be sampled. If the voltages obtained this way (mentioned at the bottom of FIG. 8) are considered again, it can be seen that these voltage samples can be grouped in pairs, each representing a differential signal. For instance, the voltage $V_C$ of node C sampled in configuration 1 and the voltage $V_C$ of node C sampled in configuration 2 form such a pair. When both the positive and the negative part of these differential signals have been sampled, they can be converted to the digital domain. The ADC used for this purpose may be implemented differentially (which is advantageous with respect to noise immunity). As a result, a digital representation of the voltage-difference is obtained: $D_{12}=(z_1\|z_2)I_{ex}/V_r$. Again, $V_r$ is the reference voltage used by the ADC. It is to be noted that with this approach, the common-mode level $V_{ref}$ is rejected due to the differential ADC structure. It is therefore not necessary to know the value of the common-mode level $V_{ref}$, and slow (e.g., temperature-related) variations can even be tolerated. Combining also other samples into differential pairs, the four digital signals of (Eq. 5) can be obtained, but now they are the result of differential circuits. As a result, the same full redundancy as described before can also be applied here.

Figure 19:
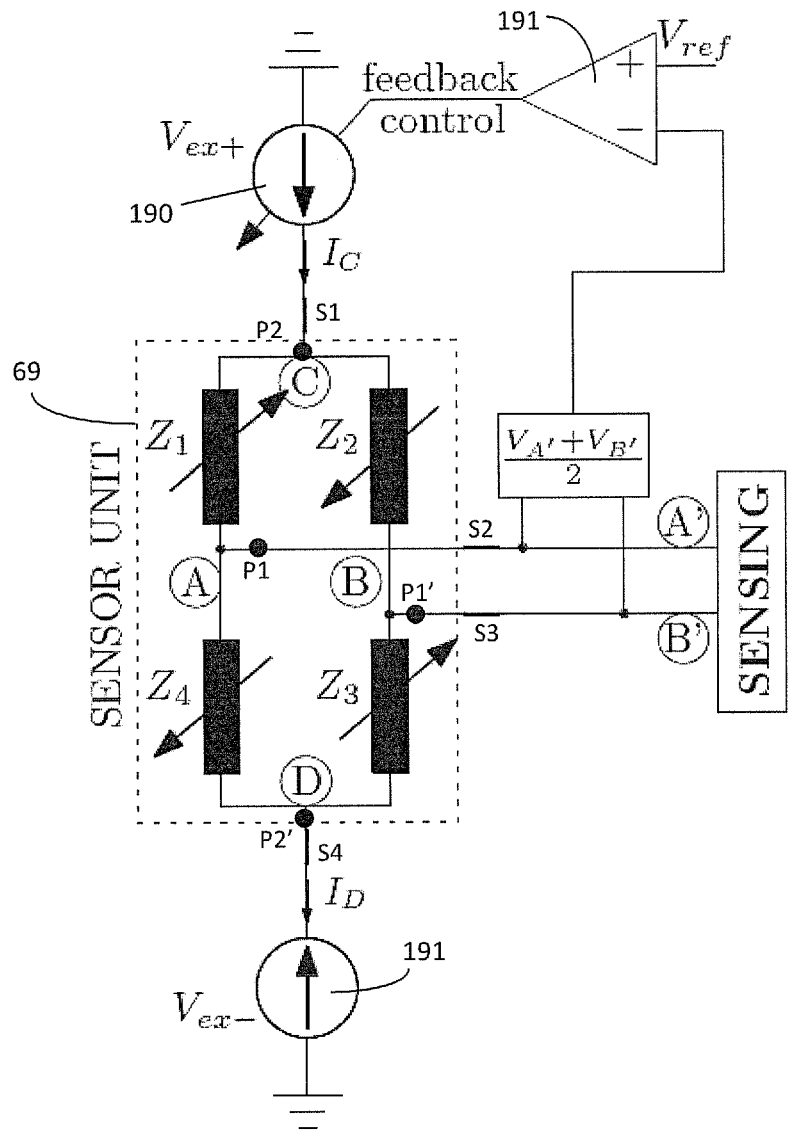
FIG. 19 illustrates an embodiments of the present invention in which a symmetrical sensor excitation to a sensor unit is provided by means of two voltage sources which are kept at an equal but inverse value with respect to the common mode voltage of the sensor unit by means of a feedback control signal.

In the above, embodiments which use current sources as a means for realizing a "symmetrical sensor excitation" have been detailed. In embodiments which use voltage sources as a means for realizing a "symmetrical sensor excitation", the sensor unit 69 is excited by two voltage sources 190, 191. Again, for sake of ease, the voltage sources 190, 191 are illustrated in FIG. 19 as providing excitation signals to the set of sensor nodes C, D via the second port P2, P2', while the sensor nodes A,B are used for sensing via the first port P1, P1'. This corresponds to one particular configuration of the sensor readout. However, as a difference measurement circuit 60 according to embodiments of the present invention is provided with switching units 61, 62 for switching excitation signals from being applied to the first set of nodes A, B via the first port P1, P1' to being applied to the second set of nodes C, D via the second port P2, P2' and vice versa, the voltage sources 190, 191 could as well be illustrated as providing excitation signals to the set of opposite nodes A, B via the first port P1, P1'. The same remark applies with respect to the sensing nodes used by the readout circuit.

Figure 20:
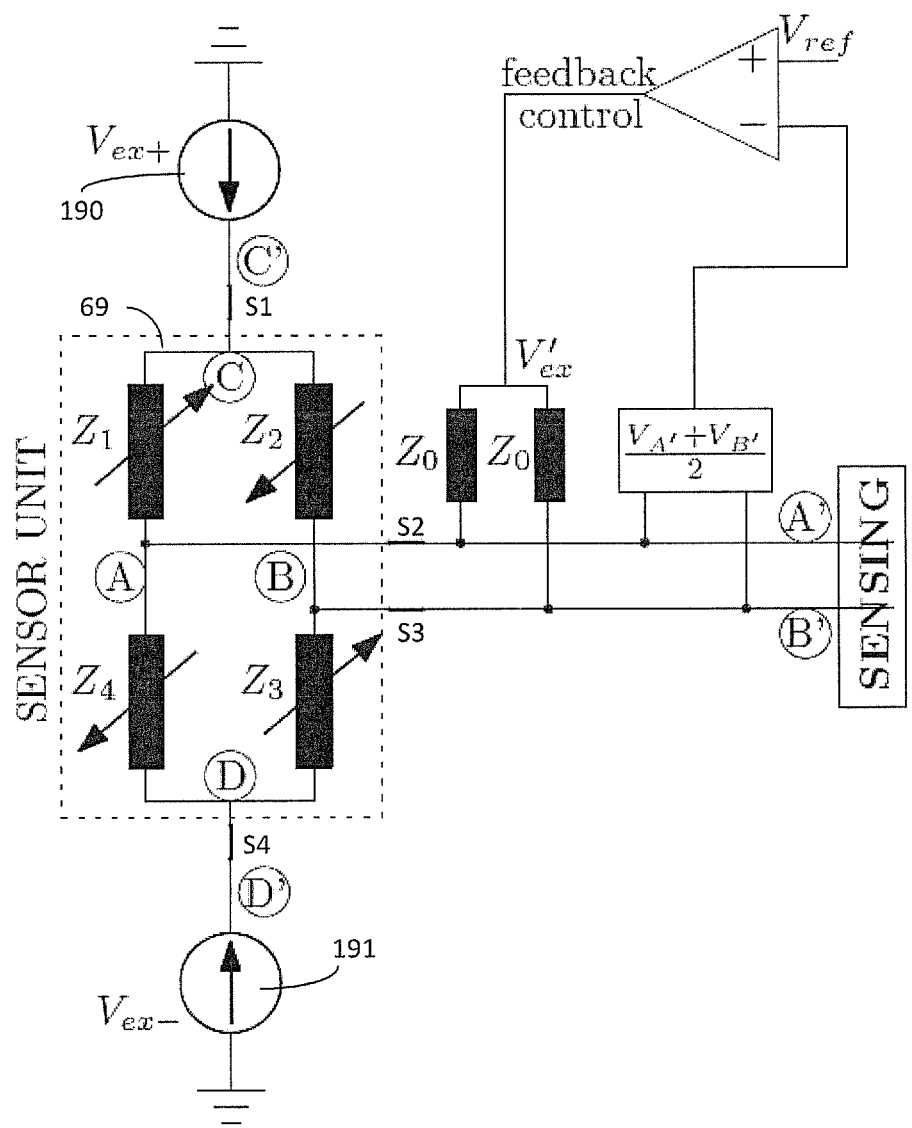
FIG. 20 illustrates an difference measurement circuit according to embodiments of the present invention, where a sensor unit is excited by two fixed voltage sources, the difference measurement circuit comprising a third adaptable voltage source, the value of which is determined by a feedback loop whose purpose is to stabilize the common-mode level voltage of the sensor unit.

Similar to the embodiment of FIG. 13 to FIG. 17, the embodiments of FIG. 19 and FIG. 20 also use a feedback loop to stabilize the common-mode voltage of the sensing nodes A', B' to a constant level $V_{ref}$. The main difference is that now a voltage source is adapted to realize the nullor operation. In a particular embodiment of this approach, an amplifier has a voltage output which can deliver enough current to excite the sensor unit 69 directly (not shown in these figures). In this case, the amplifier output can be used directly as the adapted voltage source (this is $V_{ex+}$ in FIG. 19, and $V'_{ex}$ in FIG. 20). In many cases, the amplifier has the required current-driving capabilities, and no extra measures need to be taken. If it would pose a problem, this can be remedied easily, e.g. by adding a voltage buffer as an output stage to the amplifier. The embodiments of FIG. 19 and FIG. 20 also show that the feedback voltage sources can be inserted at various points.

In the embodiment of FIG. 19, one of the voltage sources (here the top voltage source 190) can be completely controlled by the feedback loop. In this case, the first voltage source 191 is an independent voltage source, and the second voltage source 190 is a controlled voltage source. Similar to FIG. 13, a simple circuit (e.g., as shown in FIG. 22) may be used to extract the common-mode voltage of the sensing nodes A' and B', which may be electrically connected, depending on the setting of the switching units 61, 62, to the first port P1, P1' or to the second port P2, P2' of the difference measurement circuit according to embodiments of the present invention. The obtained common-mode voltage $(V_{A'}+V_{B'})/2$ of the sensing nodes A', B' is then compared to a reference value $V_{ref}$ in an amplifier 192, and the resulting amplifier output signal may be used to control the adaptable voltage source 190 so as to effectively stabilize the common-mode voltage of the sensing nodes A', B' to a value $V_{ref}$. The combination of the amplifier 192 and the adaptable voltage source 190 could also represent an amplifier with a voltage output which has sufficient current drive capabilities.

In the embodiment of FIG. 20, two independent voltage sources $V_{ex+}$ 190 and $V_{ex-}$ 191 are used for excitation of the bridge. While both sources 190, 191 are independent from each other, they generate by design complementary signals such that $V_C - V_{ref} = V_{ref} - V_D$, thus providing a symmetrical excitation to the sensor unit 69. However, because of unavoidable mismatch errors, this equation will not be perfectly met in practice. Therefore, a third adaptable voltage source $V'_{ex}$ may be introduced. The value of the adaptable source $V'_{ex}$ may be determined by a feedback loop whose purpose is to stabilize the common-mode level voltage $(V_A+V_{B'})/2$ of the sensing nodes to the constant level $V_{ref}$. In this embodiment, two nominally equal impedances $Z_0$ are used to let $V'_{ex}$ influence the common-mode level of the sensing nodes A', B'.

It is again important to understand that the above principle not only applies to DC current sources (which would be appropriate for readout of a resistive bridge as a sensor unit 69), but also works if the independent sources 190, 191 produce more complex waveforms like sinusoidal, squarewave or step-wise excitations. Furthermore, according to embodiments of the present invention alternative "hybrid" realizations of the previously presented embodiments are also possible. As an example, two independent voltage sources $V_{ex+}$ and $V_{ex-}$ as in FIG. 20 could be used, but with two adaptable current-sources as in FIG. 14 for providing feedback to the sensing nodes A', B'.

In accordance with embodiments of the present invention, a bridge readout system may be provided which includes a full redundancy check based on a voltage-mode "symmetrical sensor excitation" (FIG. 19). For this purpose, it is first explained that for the shown configuration, $V_C$ (which is also $V_{ex+}$) and the current $I_C$ contain useful redundancy-related information.

Because both $V_{ref}$ and the independent voltage excitation $V_{ex-}$ 191 are known nominally, the voltage difference $\Delta V = V_{ref} - V_{ex-}$ is also known nominally. Actually, $\Delta V$ represents the voltage drop occurring over the bottom half-bridge. The current $I_D$ is then $(Y_3+Y_4)\cdot\Delta V$. In this, the notation $Y_i$ has been introduced for representing the admittance of the bridge impedance $Z_i$. Because $I_C$ is equal to $I_D$, the following is obtained:

$$I_C = (Y_3+Y_4)\Delta V$$

Because the voltage over the top half bridge is now $(Z_1 \| Z_2) I_C$, $$V_C = V_{ref} + \frac{Y_3+Y_4}{Y_1+Y_2}\Delta V$$

The above information can be easily measured. For instance, the output stage of the amplifier could be chosen to provide an easy means for measuring the current delivered to the sensor unit. When the amplifier drives the sensor directly, it is often possible to duplicate the output structure of the amplifier (possibly a scaled version) and use the same driving signals as used in the amplifier output structure. Because of the current-mirror principle, this way a (possibly scaled) copy of the current $I_C$ delivered by the amplifier to the bridge is obtained. The voltage $V_C$ could be sampled and processed basically in the same way as described in embodiments which made use of current sources for excitation.

It can be shown that when both $I_C$ and $V_C$ are measured (and optionally converted to the digital domain for easy post-processing), and this is also repeated after rotating the bridge, enough information is available for a full redundancy test. In practice, it is often easier to measure either only $I_C$ or only $V_C$, but do this for the four configurations shown in FIG. 18. Below is shown how this is done. First, the approach based on current measurements is considered. In this approach, four current measurements are obtained, e.g. available in the digital domain (relative to a reference current level $I_r$) for easy post-processing:

$$\begin{cases} D_{12} = \frac{(Y_1+Y_2)\Delta V}{I_r} \\ D_{34} = \frac{(Y_3+Y_4)\Delta V}{I_r} \\ D_{14} = \frac{(Y_1+Y_4)\Delta V}{I_r} \\ D_{23} = \frac{(Y_2+Y_3)\Delta V}{I_r} \end{cases}$$

Based on these, the test-values $\delta_{test1}$ and $\delta_{test2}$ may be calculated according to (Eq. 6). It is then elementary to show that $\delta_{test1}=\delta_{test2}=0$ if and only if both pairs are perfectly matched ($Y_1=Y_3$ and $Y_2=Y_4$). A full redundancy test is therefore obtained. Also here, it is an advantage that the test does not dependent directly on the values $\Delta V$ and $I_r$.

Second, the approach based on voltage measurements is considered. By subtracting the $V_{ref}$ contribution and with an analog-to-digital conversion which uses the reference voltage level $V_r$, the following digital signals can be obtained (when going through the four bridge configurations shown in FIG. 8):

$$\begin{cases} D_{12} = \frac{Y_1+Y_2}{Y_3+Y_4}\Delta V / V_r \\ D_{34} = \frac{Y_3+Y_4}{Y_1+Y_2}\Delta V / V_r \\ D_{14} = \frac{Y_1+Y_4}{Y_2+Y_3}\Delta V / V_r \\ D_{23} = \frac{Y_2+Y_3}{Y_1+Y_4}\Delta V / V_r \end{cases}$$

Here, test-values $\delta_{test1}$ and $\delta_{test2}$ may be calculated according to:

$$\begin{cases} \delta_{test1} = \frac{D_{12}-D_{14}}{D_{12}+D_{14}} \\ \delta_{test2} = \frac{D_{34}-D_{23}}{D_{34}+D_{23}} \end{cases}$$

Also here it can be show that $\delta_{test1}=\delta_{test2}=0$ if and only if both pairs are perfectly matched ($Y_1=Y_3$ and $Y_2=Y_4$). Again a full redundancy test is therefore obtained, and there is the advantage that the test does not dependent directly on the values $\Delta V$ and $V_r$.

The embodiment of FIG. 20 uses two independent excitation voltages. A third voltage $V'_{ex}$ is determined by feedback, and uses two nominally equal impedances $Z_0$ to influence the common-mode level of the sensing nodes. As an example, the amplifier output voltage has been used directly as a third, adaptable voltage source. The basis for redundancy checking is now contained in the voltage $V'_{ex}$ (Eq. 7):

$$V'_{ex} = V_{ref} - \frac{Y_1+Y_2-Y_3-Y_4}{2Y_0}\Delta V$$

By converting the difference $V_{ref}-V'_{ex}$ to the digital domain (for instance using $\Delta V$ as reference value), again a digital test value $$\delta_{test1} = \frac{Y_1 + Y_2 - Y_3 - Y_4}{2Y_0}$$

is obtained. By rotating the bridge, a second digital test value can be obtained:

$$\delta_{test2} = \frac{Y_1 + Y_2 - Y_3 - Y_4}{2Y_0}$$

It is then elementary to show that $\delta_{test1} = \delta_{test2} = 0$ if and only if both pairs are perfectly matched ($Y_1 = Y_3$ and $Y_2 = Y_4$). A full redundancy test is therefore obtained using only two bridge configurations. However, it might be advantageous to include extra configurations obtained by flip-over of the bridge. It is to be noted that in a flip-over configuration of the bridge (compared to the configuration shown in FIG. 21), $V'_{ex}$ now has the value (Eq. 8):

$$V'_{ex} = V_{ref} + \frac{Y_1 + Y_2 - Y_3 - Y_4}{2Y_0} \Delta V$$

The sign difference compared to Eq. 7 is to be noted. Therefore, also here one can combine two redundancy-related voltages in pairs which form a differential signal, here the values (Eq. 6) and (Eq. 7). By using an ADC which only extracts the differential component, it can again be seen that the actual value of $V_{ref}$ does not have to be known.

Figure 21:
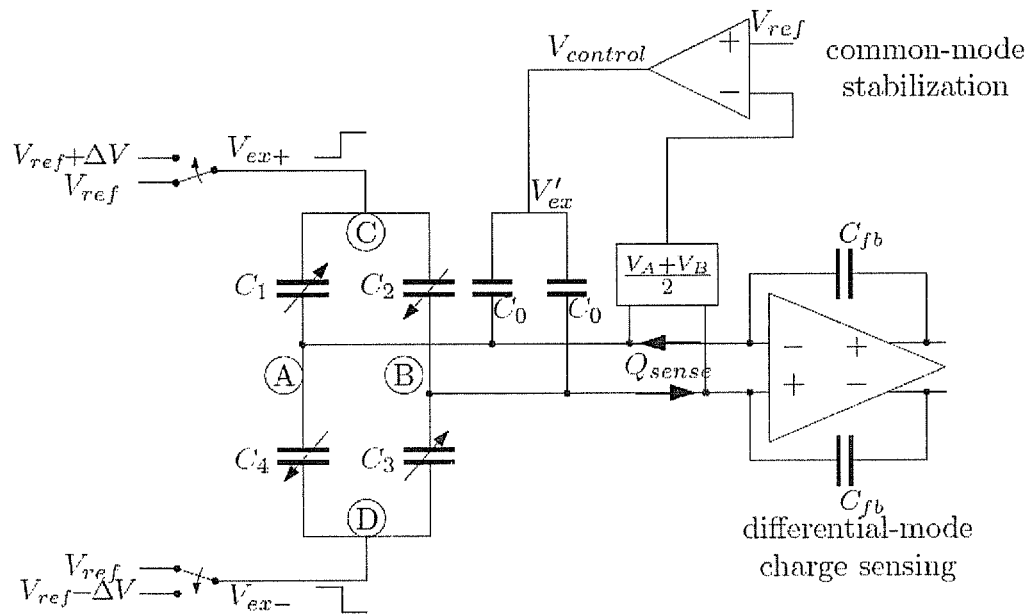
FIG. 21 illustrates an example of a capacitive readout approach according to embodiments of the present invention which allows to extract redundancy-related information.

An example of a capacitive readout interface according to embodiments of the present invention is shown in FIG. 21. This is a more detailed example of the embodiment described in FIG. 20. It is assumed that at the start of a readout operation all capacitors are discharged. In the embodiment illustrated, excitation is done by three voltage sources. Two independent sources ($V_{ex+}$ and $V_{ex-}$) are applied to the bridge excitation nodes (C, D in the example illustrated) via one of the first or second ports P1, P1' or P2, P2'. These sources $V_{ex+}$, $V_{ex-}$ realize a symmetrically applied voltage step $\Delta V$. A third voltage source is applied to two equal capacitors $C_0$ which connect to the bridge output nodes (A, B in the example illustrated) via one of the first or second ports P1, P1' or P2, P2'. This is the adaptive part of the excitation which is used for actively stabilizing the common-mode voltage of the output nodes. Because in this approach all nodes are either directly driven by a voltage source, or the nodes are virtually kept at a constant voltage, there is little interference of (mismatched) parasitic capacitors between the bridge nodes A, B, C, D and ground (these parasitics are not shown on the figure for reasons of clarity). After the applied voltage step, the voltage $V'_{ex}$ contains mismatch-related information. Indeed, based on a charge-balance it can be derived that $$V'_{ex} = V_{ref} - \frac{C_1 + C_2 - C_3 - C_4}{2C_0} \Delta V$$

In this, $\Delta V$ and $C_0$ are constant values and fairly well known. Under perfect matching conditions, $V_{ref} - V'_{ex}$ is zero. By converting the difference $V_{ref} - V'_{ex}$ to the digital domain (for instance using $\Delta V$ as reference value), again a digital test value $$\delta_{test1} = \frac{C_1 + C_2 - C_3 - C_4}{2C_0}$$

is obtained. By rotating the bridge, a second digital test value can be obtained:

$$\delta_{test2} = \frac{C_1 + C_4 - C_2 - C_3}{2C_0}$$

It is then elementary to show that $\delta_{test1} = \delta_{test2} = 0$ if and only if both pairs are perfectly matched ($C_1 = C_3$ and $C_2 = C_4$). A full redundancy test is therefore obtained for this capacitive sensor unit.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A difference measurement circuit for readout of a sensor unit, the difference measurement circuit comprising:
    a first port and a second port for connection to a first set of nodes and a second set of nodes of a sensor unit;
    switching units arranged to switch excitation signals emanating from excitation nodes from being applied to the first set of nodes via the first port to being applied to the second set of nodes via the second port and to switch differential measurement signals measured at sensing nodes from being obtained from the second set of nodes via the second port to being obtained from the first set of nodes via the first port;
    redundancy testing circuitry arranged to evaluate similarity or deviation between measurement signals obtained in different states of the switching units;
    excitation circuitry electrically coupled by switching units to the first port or to the second port to enable excitation of the sensor unit, wherein the excitation circuitry comprises a first excitation source electrically connected to the first switching unit and a second excitation source electrically connected to the second switching unit to provide a symmetrical excitation to the sensor unit, and
    a measurement circuit that determines a linear combination of voltages at the sensing nodes and/or at the excitation nodes, wherein one of the first or second excitation sources is an independent source, and the other one of the first or second excitation sources is an adaptable source, the excitation circuitry being provided with a feedback circuit that stabilizes the linear combination of the voltages at excitation nodes and/or at sensing nodes to a predetermined value.

2. A difference measurement circuit for readout of a sensor unit, the difference measurement circuit comprising:
a first port and a second port for connection to a first set of nodes and a second set of nodes of a sensor unit;
switching units arranged to switch excitation signals emanating from excitation nodes from being applied to the first set of nodes via the first port to being applied to the second set of nodes via the second port and to switch differential measurement signals measured at sensing nodes from being obtained from the second set of nodes via the second port to being obtained from the first set of nodes via the first port;
redundancy testing circuitry arranged to evaluate similarity or deviation between measurement signals obtained in different states of the switching units, and
excitation circuitry electrically coupled by switching units to the first port or to the second port to enable excitation of the sensor unit, wherein the excitation circuitry comprises a first excitation source electrically connected to the first switching unit and a second excitation source electrically connected to the second switching unit to provide a symmetrical excitation to the sensor unit,
wherein both the first and second excitation sources are independent sources of nominally equal value, the excitation circuitry further comprising at least one adaptable source configured for injecting a nominally equal amount of current to both sensing nodes, the excitation circuitry further being provided with a feedback circuit that controls the at least one adaptable source that stabilizes the linear combination of the voltages at excitation nodes and/or at sensing nodes to a predetermined value.

3. A difference measurement circuit for readout of an impedance bridge, the difference measurement circuit comprising a first port and a second port for connection to a first set of nodes and a second set of nodes of the impedance bridge, the circuit further comprising
switching units arranged to switch excitation signals emanating from excitation nodes from being applied to the first set of nodes via the first port to being applied to the second set of nodes via the second port and to switch differential measurement signals measured at sensing nodes from being obtained from the second set of nodes via the second port to being obtained from the first set of nodes via the first port, and
redundancy testing circuitry arranged to evaluate similarity or deviation between measurement signals obtained in different states of the switching units such as to make a distinction, based on the measurement signals, between impedance variations due to a sensed physical signal and variations due to mismatch.

4. The difference measurement circuit according to claim 3, wherein the redundancy testing circuitry is arranged to evaluate similarity or deviation of the differential measurement signals measured at the sensing nodes.

5. The difference measurement circuit according to claim 3, wherein the redundancy testing circuitry is arranged to evaluate similarity or deviation of measurement signals at excitation nodes resulting from a current and/or a voltage applied as an excitation to the impedance bridge.

6. The difference measurement circuit according to claim 3, wherein the redundancy testing circuitry comprises a control unit providing a control signal that controls the switching operation of the switching units and raises an error when the deviations between measurement signals obtained for different values of the control signal are attributable to sensor unit failure.

7. The difference measurement circuit according to claim 3, wherein said control unit provides said control signal such that the control signal takes on zero-mean random or pseudo-random values.

8. The difference measurement circuit according to claim 3, comprising excitation circuitry electrically coupled by switching units to the first port or to the second port to enable excitation of the impedance bridge, wherein the excitation circuitry comprises a first excitation source electrically connected to the first switching unit and a second excitation source electrically connected to the second switching unit to provide a symmetrical excitation to the impedance bridge.

9. The difference measurement circuit according to claim 8, comprising a measurement circuit that determines a linear combination of voltages at the sensing nodes and/or at the excitation nodes, wherein one of the first or second excitation sources is an independent source, and the other one of the first or second excitation sources is an adaptable source, the excitation circuitry being provided with a feedback circuit that stabilizes the linear combination of the voltages at excitation nodes and/or at sensing nodes to a predetermined value.

10. The difference measurement circuit according to claim 8, wherein both the first and second excitation sources are independent sources of nominally equal value, the excitation circuitry further comprising at least one adaptable source configured for injecting a nominally equal amount of current to both sensing nodes, the excitation circuitry further being provided with a feedback circuit that controls the at least one adaptable source that stabilizes the linear combination of the voltages at excitation nodes and/or at sensing nodes to a predetermined value.

* * * * *